(12) United States Patent
Fukshima et al.

(10) Patent No.: US 8,049,233 B2
(45) Date of Patent: Nov. 1, 2011

(54) LIGHT-EMITTING DEVICE

(75) Inventors: Hiroshi Fukshima, Kadoma (JP); Masaharu Yasuda, Takarazuka (JP); Kazuyuki Yamae, Osaka (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 366 days.

(21) Appl. No.: 11/813,370

(22) PCT Filed: Mar. 9, 2007

(86) PCT No.: PCT/JP2007/054654
§ 371 (c)(1),
(2), (4) Date: Jul. 5, 2007

(87) PCT Pub. No.: WO2007/105626
PCT Pub. Date: Sep. 20, 2007

(65) Prior Publication Data
US 2009/0267092 A1    Oct. 29, 2009

(30) Foreign Application Priority Data
Mar. 10, 2006    (JP) .................................. 2006-065141

(51) Int. Cl.
*H01L 33/00* (2010.01)
*H01L 21/00* (2006.01)
(52) U.S. Cl. ................ 257/98; 438/29; 438/22; 438/42; 257/E33.072; 257/E33.065; 257/E33.067; 257/E33.068; 257/E33.069
(58) Field of Classification Search ..................... 257/98, 257/E33.074, E33.065, E33.072, E33.067–E33.069; 438/69, 72, 29, 22, 42
See application file for complete search history.

(56) References Cited

U.S. PATENT DOCUMENTS

| | | | |
|---|---|---|---|
| 4,991,179 A | 2/1991 | Deppe et al. | |
| 5,779,924 A | 7/1998 | Krames et al. | |
| 6,838,704 B2* | 1/2005 | Lin et al. | 257/98 |
| 6,969,946 B2 | 11/2005 | Steranka et al. | |

(Continued)

FOREIGN PATENT DOCUMENTS

CN    1472826 A    2/2004

(Continued)

OTHER PUBLICATIONS

Schnitzer, et al. 30% external quantum efficiency from surface textured, thin-film light-emitting diodes, *Appl. Phys. Lett.* 63 (16):2174-2176 (1993).

(Continued)

*Primary Examiner* — Thanh V Pham
*Assistant Examiner* — Maria Ligai
(74) *Attorney, Agent, or Firm* — Greenblum & Bernstein, P.L.C.

(57) ABSTRACT

A light-emitting device of the present invention includes: a semiconductor layer 1 including a light-emitting layer 12; a recess/projection portion 14 including recesses and projections formed in a pitch larger than a wavelength of light emitted from the light-emitting layer 12, the recess/projection portion 14 being formed in a whole area or a partial area of the surface of the semiconductor layer which light is emitted from; and a reflective layer formed on an opposite surface of the semiconductor layer to the surface from which light is emitted, the reflective layer having a reflectance of 90% or more. According to the light-emitting device having such arrangement, the light can be emitted efficiently by synergetic effect of the reflective layer and the recess/projection portion.

21 Claims, 21 Drawing Sheets

U.S. PATENT DOCUMENTS

| | | | |
|---|---|---|---|
| 6,987,613 | B2 | 1/2006 | Pocius et al. |
| 7,161,188 | B2 | 1/2007 | Orita |
| 2002/0123164 | A1* | 9/2002 | Slater et al. ............... 438/39 |
| 2002/0141006 | A1 | 10/2002 | Pocius et al. |
| 2003/0222259 | A1* | 12/2003 | Senda et al. ............... 257/13 |
| 2004/0016936 | A1 | 1/2004 | Tanaka et al. |
| 2004/0104395 | A1 | 6/2004 | Hagimoto et al. |
| 2004/0119085 | A1* | 6/2004 | Bader et al. ............... 257/98 |
| 2004/0201110 | A1* | 10/2004 | Venugopalan et al. ....... 257/778 |
| 2004/0206969 | A1 | 10/2004 | Orita |
| 2005/0087755 | A1 | 4/2005 | Kim et al. |
| 2005/0110032 | A1* | 5/2005 | Saito et al. ............... 257/98 |
| 2005/0205875 | A1 | 9/2005 | Shei et al. |
| 2005/0211997 | A1 | 9/2005 | Suehiro et al. |
| 2005/0285494 | A1* | 12/2005 | Cho et al. ............... 313/112 |
| 2006/0204865 | A1* | 9/2006 | Erchak et al. ............... 430/7 |

FOREIGN PATENT DOCUMENTS

| | | |
|---|---|---|
| CN | 1538537 A | 10/2004 |
| CN | 1612367 A | 5/2005 |
| EP | 0977280 | 2/2000 |
| JP | 7-202257 | 8/1995 |
| JP | 10-4209 | 1/1998 |
| JP | 2001-177157 | 6/2001 |
| JP | 2003-17740 | 1/2003 |
| JP | 2004-153277 | 5/2004 |
| JP | 2005-79298 | 3/2005 |
| JP | 2006-49855 | 2/2006 |
| KR | 2005-111666 | 11/2005 |
| WO | 02/061847 | 8/2002 |
| WO | 2006/013698 | 2/2006 |

OTHER PUBLICATIONS

English language abstract of JP 7-202257.
English language abstract of JP 10-4209.
English language abstract of JP 2003-17740.
English language abstract of JP 2005-79298.
English language abstract of JP 2004-153277.
English language abstract of JP 2006-49855.
Schnitzer, et al. Ultrahigh spontaneous emission quantum efficiency, 99.7% internally and 72% externally, from AlGaAs/GaAs/AlGaAs double heterostructures *Appl. Phys. Lett.* 62 (2):131-133 (1993).
Chinese Office Action issued in connection with CN 2007800080907 Sep. 25, 2009, along with a partial English language translation thereof.
Chinese Office Action issued in connection with CN 200780008090.7 Sep. 25, 2009, along with a partial English language translation thereof.
Korean Office Action dated May 20, 2010 that issued with respect to Korean Patent Application No. 10-2008-7023966, along with a partial English language translation thereof.
Extended European Search Report issued with respect to European Patent Application No. 07738139.0, dated Jul. 29, 2011.

* cited by examiner

LIGHT-EMITTING DEVICE

TECHNICAL FIELD

The present invention relates to a light-emitting device including a semiconductor.

BACKGROUND ART

In recent years, the development of a light-emitting device is remarkable which adopts a III-V compound (hereinafter, referred to as "nitride") or II-VI compound formed with a quantum well therein and generates light by binding electrons with holes respectively in the quantum well with electric current applied from outside.

A material which is used mostly as the III-V compound is a GaN of the nitride. Commencing with the GaN, the refractive index of the nitride is larger than 1. Accordingly, there is a problem in extracting light from a light-emitting device to the atmosphere. For example, in the case of the GaN as an example, the refractive index is about 2.5. Accordingly, light incident to a normal line on a boundary between the GaN and the atmosphere at an angle which is larger than a predetermined angle (for example, 23.6 degrees) is not emitted to the atmosphere but totally reflected on the boundary surface and trapped in a GaN layer in the light-emitting device. Hereinafter, a conical area formed in an area having an angle smaller than a predetermined angle with respect to the normal line is referred to as an "escape cone."

Most part of light trapped in the GaN layer is reabsorbed in a crystal and an electrode material and changed to a heat, and is not extracted to outside. Therefore, there is a problem that the light-extraction efficiency is not improved when a flat GaN layer is used.

Therefore, with respect to such problem, the Patent Document 1 discloses, as shown in FIG. 34, a technology of forming rectangular recesses and projections having a pitch of 2 to 4 μm and a depth of $\lambda^*(2n+1)/4 (n=1, 2, \ldots)$ on a light-extraction surface through which the light from the light-emitting device is emitted. According to this technology, light rays reflected respectively on the recesses and projections eliminate each other by having a difference of $\lambda/2$ in a phase. Accordingly, the light reflected on the light-extraction surface is reduced. Consequently, the light-extraction efficiency can be improved.

Further, the Patent Document 2 discloses, as shown in FIG. 35, a technology of forming a periodically ordered boundary face structure on a predetermined boundary face of an LED to improve the light-extraction efficiency. According to this technology, the light-extraction efficiency of light incident at an angle equal to or larger than the total reflection angle is improved. In accordance with a shape, doubled light-extraction efficiency can be obtained as compared to the case where there is no such structure.

Here, it is known that the light-extraction efficiency of light extracted from one boundary face or surface in the case where there is no normal surface shape can be given by $n2^2/4^*n1^2$ when it is taking in consideration a solid angle of the escape cone and given that n1 being a refractive index of a portion including a light-emitting layer and n2 being a refractive index of an outer portion. Thus, in the case where a semiconductor layer is the GaN and its exterior is air, the light-extraction efficiency is calculated to be 4% since it is given that n1=2.5, n2=1. Further, if the light is extracted from all of the surfaces other than the bottom surface, and the structure is formed only on the upper surface so that the doubled light-extraction efficiency is obtained, a light-extraction efficiency of 24%=4*4 (side surfaces)+4*2 (doubled as the upper surface having recesses and projections) can be obtained.

Further, the Non-Patent Document 1 discloses, as shown in FIG. 36, a technology of forming a random texture or applying a rough finishing onto a surface of a semiconductor LED. According to this technology, an angular distribution of a light ray in the device is made random by the random texture formed on the surface. After taking multiple paths in accordance with the device structure, a possibility that the light escapes becomes high. Consequently, the light-extraction efficiency can be improved. It should be noted that a hatched layer in FIG. 36 is an active layer.

However, according to the respective methods shown in the Patent Documents 1, 2, light incident at an angle equal to or larger than the total reflection angle is not extracted from the GaN. Accordingly, there is a predetermined limit in improvement of the light-extraction efficiency. Further, since the recesses and projections are formed on the surface, the incident angle of light extracted from one point light source becomes wider as compared to the flat surface. However, the light-extraction efficiency at an angle where the light is essentially emitted is reduced. Accordingly, merely double at most in improvement in the light-extraction efficiency can be obtained.

Further, the Patent Document 2 also discloses a method for improving the light-extraction efficiency by adopting a resonator structure to limit distribution of emitted light to be within the escape cone. However, since the resonator structure is adopted in this method, accuracy in a resonator length (thickness of a semiconductor layer) is required. Accordingly, it becomes difficult to improve an extraction rate. Further, in the resonator structure, controlling all of the emitted light to be within the escape cone is fundamentally impossible, and improvement in the light-extraction efficiency is limited to about 50%.

Further, in the technology of the Non-Patent Document 1, a light ray taking multiple paths is absorbed by a reflective layer such as an electrode and reduces its strength drastically before it escapes. Further, even if a reflectance of the reflective layer is improved, the light-extraction efficiency may be rather reduced in the case where not only a pitch but also a shape is random, as can be seen in FIG. 36. Accordingly, the light-extraction efficiency is not improved. This fact is confirmed by experiments performed by the inventors of the present invention. In the experiment, a random and rough shape of surface obtained by applying a wet etching to polycrystal silicon is transferred onto and duplicated on the light-extraction surface.

Patent Document 1: Japanese Unexamined Patent Publication No. HEI07-202257
Patent Document 2: Japanese Unexamined Patent Publication No. HEI10-4209
Non-Patent Document 1: Schnitzer, et al. In Applied Physics Letters 63, 2174 (1993)

DISCLOSURE OF THE INVENTION

The present invention was worked out in view of the above-described circumstances, and its object is to provide a semiconductor light-emitting device capable of extracting light efficiently.

The light-emitting device according to the present invention includes: a recess/projection portion having recesses and projections formed on a partial or whole surface of a semiconductor layer on a side from which light is extracted in a pitch larger than a wavelength of light emitted from a light-emitting layer in a semiconductor layer; and a reflective layer formed on a surface of the semiconductor layer opposite to the surface from which the light is extracted and having a reflectance of 90% or more. Of course, since a reflective layer is formed on a surface of the semiconductor layer, the reflectance indicates the reflectance of the reflective layer with respect to the semiconductor layer. In the light-emitting device having such arrangement, a light is extracted efficiently. Further, the light-emitting device according to the present invention can be applied not only to an LED but can be also applied to a laser diode, an organic EL, an inorganic EL and the like.

BRIEF DESCRIPTION OF THE DRAWINGS

FIG. 3 shows an effect of a recess/projection portion 14.

FIG. 9 is a view showing a structure of the light-emitting device in the case where small lens portions 142a of the Fresnel lens shown in FIG. 8 is composed of a sub-wavelength diffractive lattice.

FIGS. 29A and 29B are sectional views showing structures of n-type electrodes 5a.

BEST MODE EMBODIMENT FOR CARRYING OUT THE INVENTION

Hereinafter, an embodiment of the present invention will be described with reference to the drawings. It should be noted that arrangements provided with the same reference signs in each figure indicate that they have the same arrangements, and descriptions thereof will be omitted.

Embodiment 1

Figure 1:
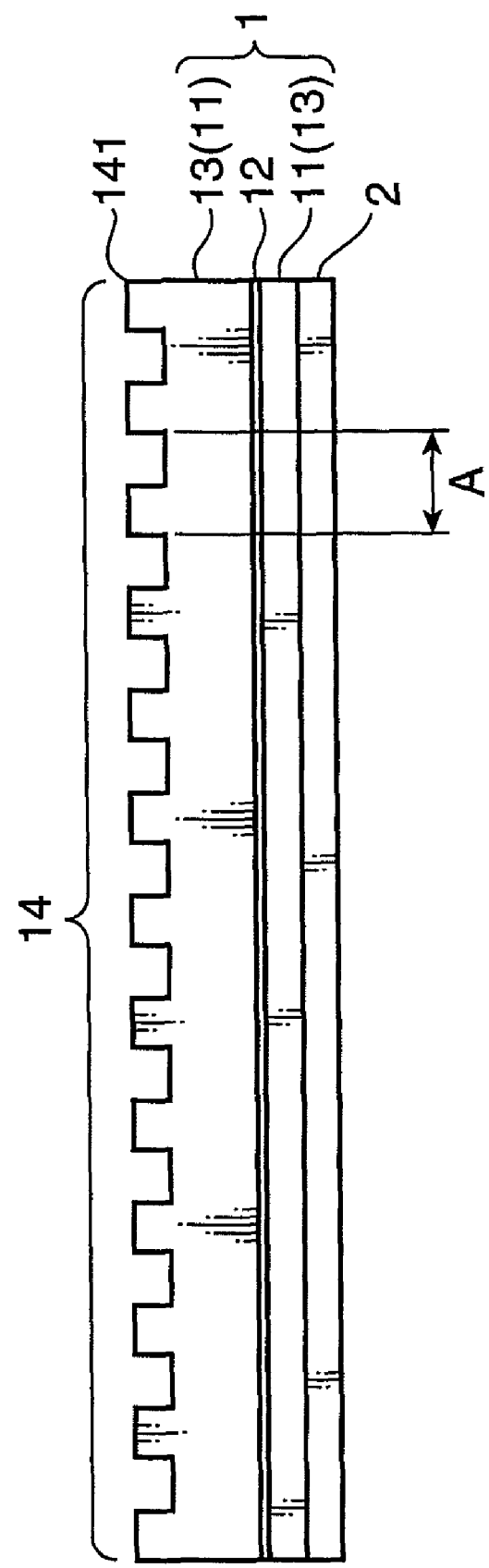
FIG. 1 is a sectional view showing a structure of a light-emitting device according to the embodiment 1 of the present invention.
Figure 2:
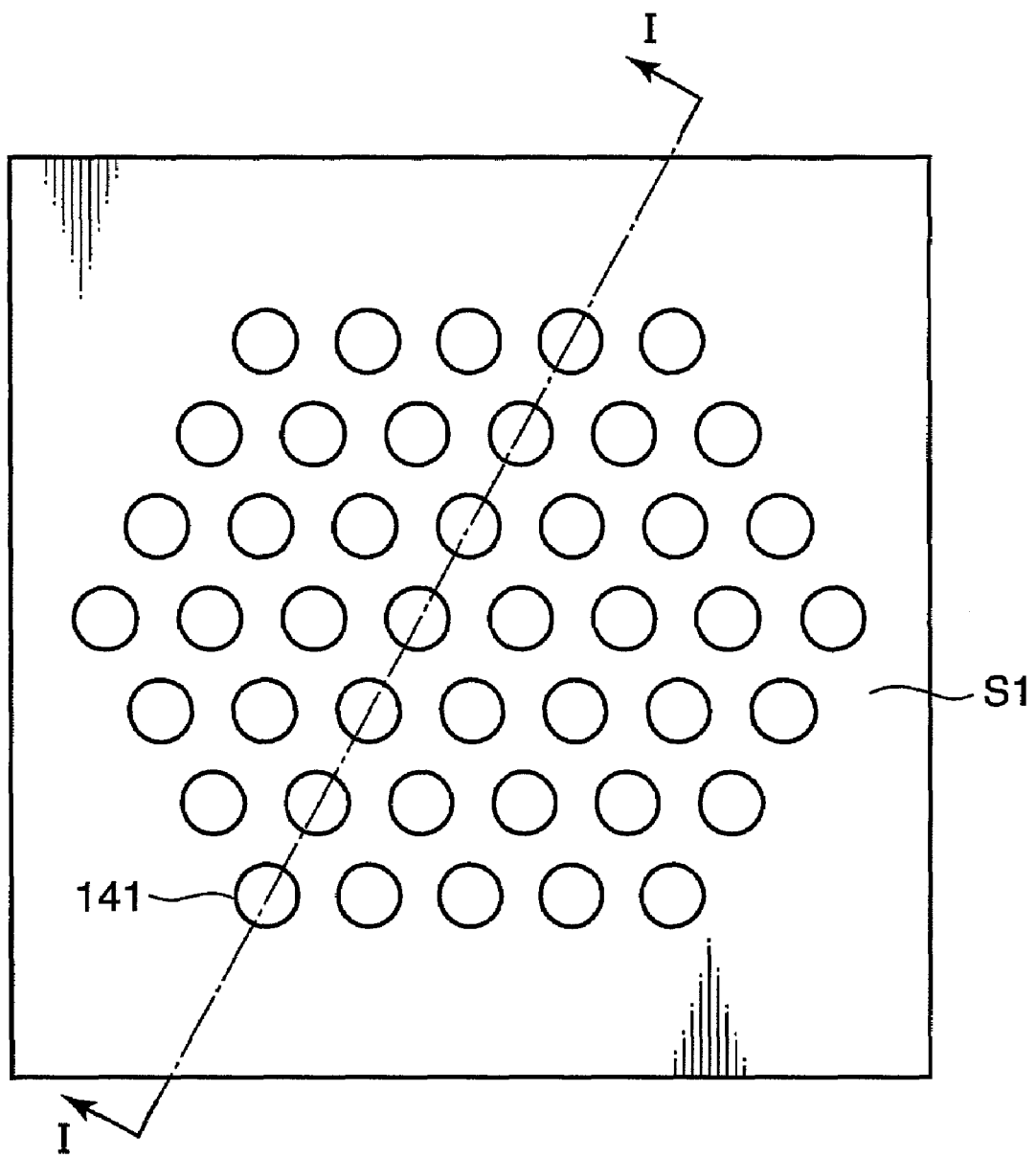
FIG. 2 is a top view of the light-emitting device according to the Embodiment 1.

FIG. 1 is a sectional view showing a structure of a light-emitting device according to Embodiment 1 of the present invention, and FIG. 2 is a top view showing the same. In FIG. 2, a cross-section of FIG. 1 is indicated by reference signs I-I. FIG. 1 shows a cross-section of one chip. A size of each chip is, for example, 0.3 to 1 mm square. FIG. 2 shows a partial front view of FIG. 1.

As shown in FIG. 1, the light-emitting device includes a semiconductor layer 1 including a GaN system material and a reflective layer 2 formed under the lower surface of the semiconductor layer 1. The semiconductor layer 1 has a p-type semiconductor layer 11 formed on the upper surface of the reflective layer 2, a light-emitting layer 12 formed on the upper surface of the p-type semiconductor layer 11, and an n-type semiconductor layer 13 formed on the upper surface of the light-emitting layer 12.

On an upper surface of the n-type semiconductor layer 13, projected portions 141 are formed in a constant spacing A (period A). The spacing A is longer than a wavelength in the semiconductor layer 1 of light emitted from the light-emitting layer 12. Specifically, if it is given that a wavelength of light emitted from the light-emitting layer 12 being λ and a refractive index of the semiconductor layer 1 being n, the spacing A corresponds to A≧λ/n. In the example shown in FIG. 1, a surface on the side from which the light is extracted is the upper surface of the n-type semiconductor layer 13. Further, in view of improving the light-extraction efficiency, it is preferable that shapes of respective cross-sections of recessions and projections in the projected portion 141 are substantially analogous.

As shown in FIG. 2, each of the projected portions 141 has a circular shape from a top view. Specifically, each of the projected portions 141 has a cylindrical shape having the same height and radius.

The reflective layer 2 includes a member such as metal having a reflectance of 90% or more with respect to a wavelength of light emitted from the light-emitting layer 12. This kind of light-emitting device can be easily produced by using the MOCVD method known to a person skilled in the art.

Figure 3A:
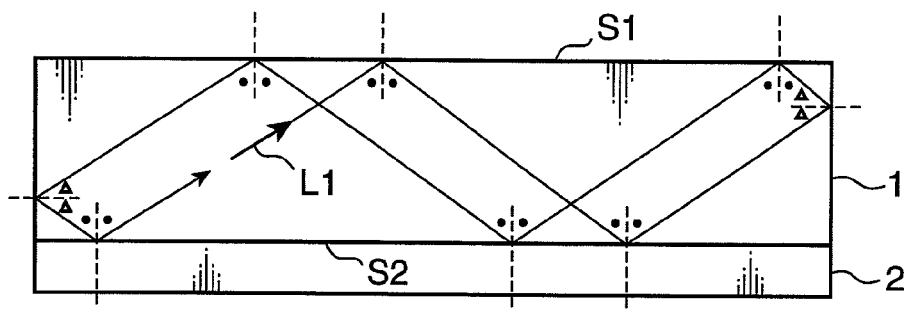
FIG. 3A shows the light-emitting device on which the recess/projection portion 14 is not formed.
Figure 3B:
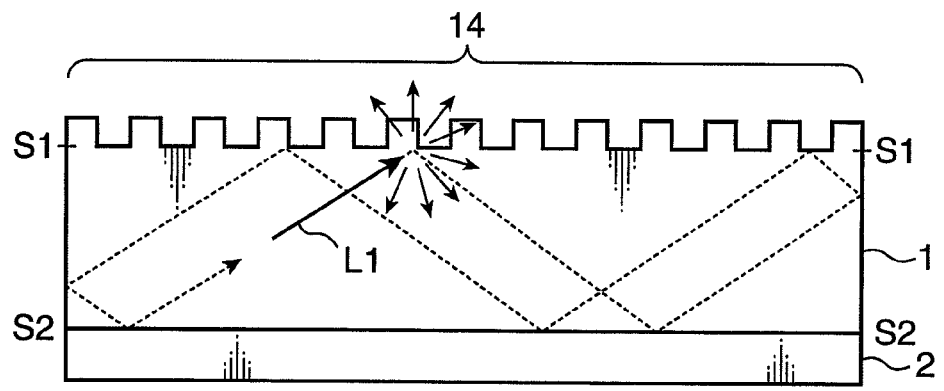
FIG. 3B shows the light-emitting device on which the recess/projection portion 14 is formed.
Figure 3C:
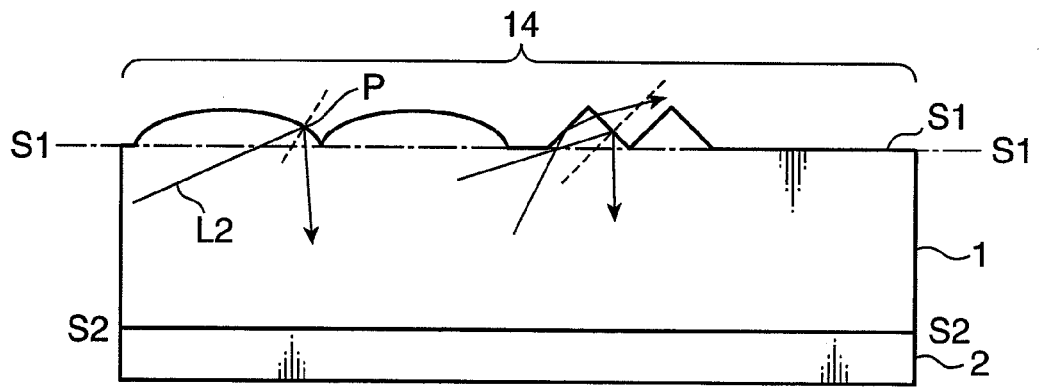
FIG. 3C shows the case where an spacing A of projected portions 141 of the recess/projection portion 14 is set to be more than ten times larger than a wavelength of light.

FIG. 3 shows effects of the recess/projection portion 14. FIG. 3A shows the light-emitting device on which the recess/projection portion 14 is not formed. FIG. 3B shows the light-emitting device on which the recess/projection portion 14 is formed. FIG. 3C shows the case where the spacing A of projected portions 141 of the recess/projection portion 14 is set to be more than ten times larger than a wavelength of light. As shown in FIG. 3A, in the case where the recess/projection portion 14 is not formed on the upper surface (the surface on the side from which light is extracted) of the semiconductor layer 1, in other words, in the case where the upper surface of the semiconductor layer 1 is a flat surface, a light L1 emitted from the light-emitting layer 12 in a direction of escaping from an escape cone is not extracted from the upper surface S1 of the semiconductor layer 1 but regularly reflected and led to a lower surface S2 of the semiconductor layer 1. Then, the light is reflected on the lower surface S2. The regular reflection is repeated in the semiconductor layer 1 in the above-described manner, and the light does not enter the escape cone forever. Accordingly, the light-extraction efficiency is lowered.

On the other hand, as shown in FIG. 3B, when the recess/projection portion 14 is formed on the upper surface S1 to have an spacing A larger than a wavelength of light emitted from the light-emitting layer 12, the light L1 which is not extracted from but reflected on the recess/projection portion 14 is affected by diffraction and scattering by the recess/projection portion 14 and reflected in a direction other than a regular reflection with respect to the upper surface S1 (angle changing action). Accordingly, light originally emitted in a direction toward outside of the escape cone repeats multiple reflections and escapes in due course. Finally, the light is extracted from the recess/projection portion 14.

Further, as shown in FIG. 3C, in the case where the spacing A is set to be 10 times or more larger than a wavelength of light emitted from the light-emitting layer 12, light L2 emitted out of the escape cone is regularly reflected at a point P when the semiconductor layer 1 is viewed microscopically. However, when the semiconductor layer 1 is viewed macroscopically, the light L2 is reflected in a direction being greatly different from the regular reflection with respect to the upper surface S1 on which the recess/projection portion 14 is formed. Accordingly, it can be seen that the angle changing action of the recess/projection portion 14 becomes great.

Figure 4:
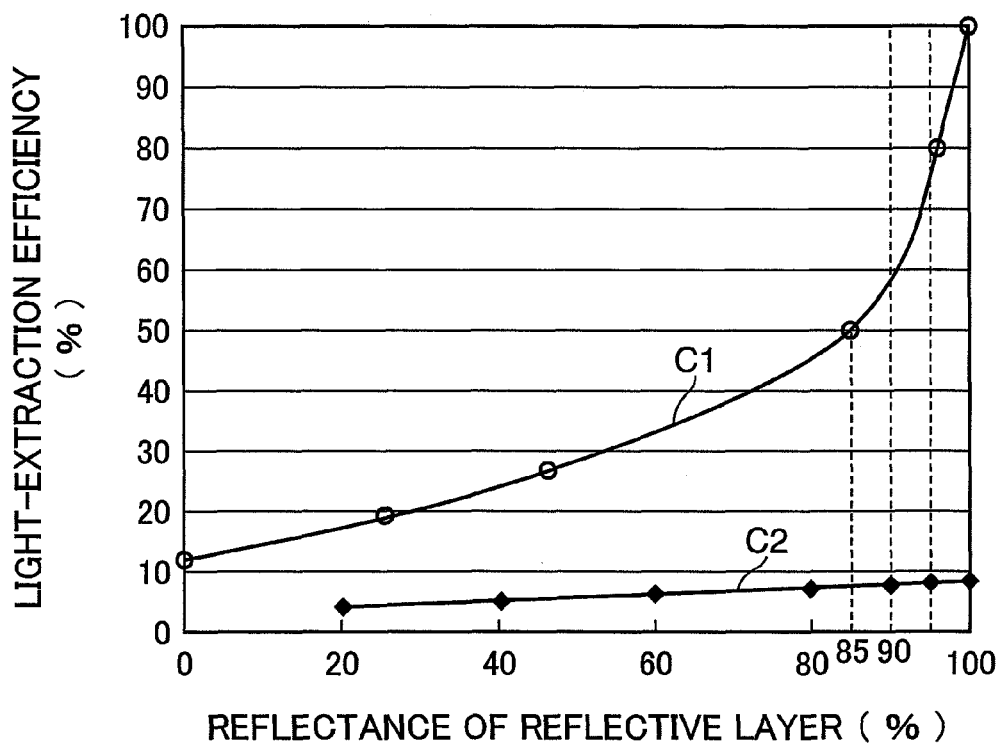
FIG. 4 is a graph showing an effect of combining the recess/projection portion 14 and a reflective layer 2.

FIG. 4 is a graph showing an effect of combining the recess/projection portion 14 and the reflective layer 2. In the graph shown in FIG. 4, the vertical axis shows the light-extraction efficiency, and the horizontal axis shows the reflectance of the reflective layer. The graph C1 with white circles ○ plotted thereon shows the case where the light-emitting device according to the Embodiment 1 including the semiconductor layer 1 and the reflective layer 2. The semiconductor layer 1 is formed with the recess/projection portion 14 on its upper surface S1. The graph C2 with black rhombuses ◆ plotted thereon shows the case where a light-emitting device including a semiconductor layer which is not formed with the recess/projection portion 14 on its upper surface S1 and a reflective layer. Further, in this graph, the light-emitting device is used which has an spacing A of 350 nm for the recess/projection portion 14, a diameter of 245 nm for each projected portion 141 and the height of 100 nm for each projected portion 141.

As shown in the graph C1, in the light-emitting device according to the Embodiment 1, the light-extraction efficiency gradually increases when the reflectance of the reflective layer 2 is between 0 and 85%. However, the light-extraction efficiency increases drastically when the reflectance of the reflective layer 2 is 85% or more. Especially in the area where the reflectance of the reflective layer 2 is 90% or more, it can be seen that the light-extraction efficiency is raised by 20% when the reflectance of the reflective layer 2 increases by 5%. From the descriptions above, it can be seen that it is preferable to set the reflectance of the reflective layer 2 to be 85% or more. More preferably, the reflectance should be set between 90% and 100%, and further preferably between 95% and 100%.

On the other hand, as shown in the graph C2, the light-extraction efficiency increases linearly as the reflectance of the reflective layer 2 increases in the light-emitting device not provided with the recess/projection portion 14. However, the increase rate is eminently lower than the increase rate in the area the graph C1 where the reflectance is between 0% and 85%. Further, even if the reflectance of the reflective layer 2 becomes 100%, the light-extraction efficiency is lower than 10%. Therefore, it can be seen that the light-extraction efficiency is hardly improved if the reflective layer 2 is provided but the recess/projection portion 14. Thus, the light-emitting device according to the Embodiment 1 is capable of drastically increasing the light-extraction efficiency with a synergic effect of combining the recess/projection portion 14 and the reflective layer 2.

As described above, according to the light-emitting device of the Embodiment 1, the recess/projection portion 14 is formed on the upper surface S1 of the semiconductor layer 1, and the reflective layer 2 having the reflectance of 90% or more is formed under the lower surface S2 in accordance with the experimental fact described above. Accordingly, the light-extraction efficiency can be improved.

In the above-described Embodiment 1, the semiconductor layer 1 includes the p-type semiconductor layer 11 formed on the upper surface of the reflective layer 2, the light-emitting layer 12 formed on the upper surface of the p-type semiconductor layer 11 and the n-type semiconductor layer 13 formed on the upper surface of the light-emitting layer 12, and the projected portions 141 are formed on the upper surface of the n-type semiconductor layer 13 in a predetermined spacing A. However, the semiconductor layer 1 may include the n-type semiconductor layer 13 formed on the upper surface of the reflective layer 2, the light emitting layer 12 formed on the upper surface of the n-type semiconductor layer 13 and the p-type semiconductor layer 11 formed on the upper surface of the light-emitting layer 12, and the projected portions 141 may be formed on the upper surface of the p-type semiconductor layer 11 in a predetermined spacing A. Positions of the n-type semiconductor layer 13 and the p-type semiconductor layer 11 may be interchanged also in the following embodiment.

Embodiment 2

Next, a light-emitting device according to Embodiment 2 will be described. The light-emitting device according to the Embodiment 2 is characterized in that a structure of the recess/projection portion 14 differs from that of the light-emitting device according to the Embodiment 1.

Figure 5:
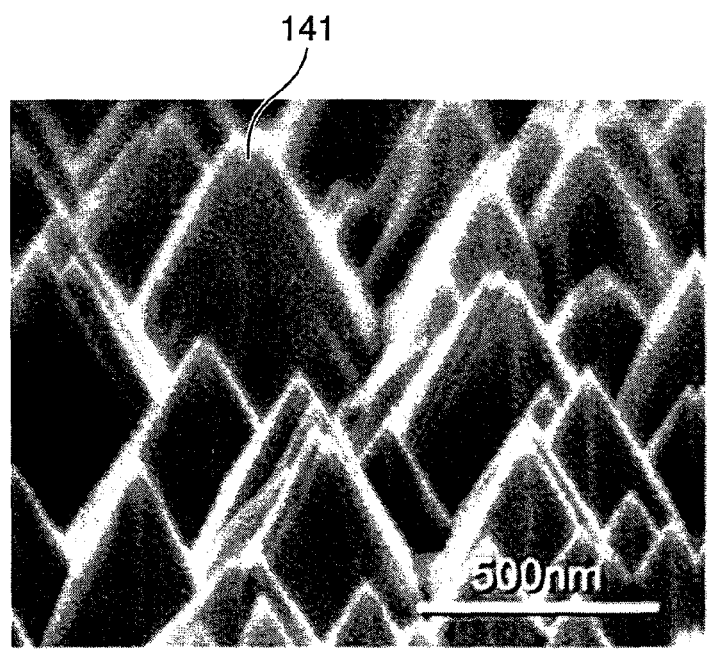
FIG. 5 is an enlarged view showing from obliquely upward the recess/projection portion 14 of the light-emitting device according to the Embodiment 2.

FIG. 5 is an enlarged view showing from obliquely upward the recess/projection portion 14 of the light-emitting device according to the Embodiment 2. Since the structure of the light-emitting device according to the Embodiment 2 is the same as that of the light-emitting device according to the Embodiment 1 except for the structure of the recess/projection portion 14, descriptions will be omitted.

As shown in FIG. 5, each of the projected portions 141 has a shape of six-sided pyramid. Further, the projected portions 141 are arranged so as to be randomly spread with the spacing A within a predetermined range having a center value of several folds (for example, double, five times, ten times, and the like) larger than the wavelength in the semiconductor layer 1 of light emitted from the light-emitting layer 12 but not smaller than the wavelength. For example, in the case where the semiconductor layer 1 is composed of a GaN system material, the refractive index is about 2.5. Accordingly, if light having a wavelength of 460 nm is emitted from the light-emitting layer 12, a wavelength in the semiconductor layer 1 of the emitted light would be 184 (=460/2.5) nm. Thus, if the projected portions 141 are arranged randomly at the spacing A with a predetermined spreading within a range having a center value of some hundred (for example, 500) nm and not being lower than 184 nm, light which has not been extracted from the recess/projection portion 14 is reflected at an angle being other than the regular reflection and having a predetermined spreading. Accordingly, the possibility that the light escapes from the recess/projection portion 14 after the multiple reflections can be made higher.

The projected portions 141 having a random spacing A can be produced masklessly and easily with low cost by an optical etching of etching a KOH solution (potassium hydroxide solution) while irradiating light. The six-sided pyramid is adopted as a shape of the projected portion 141 in view of making a production process easier. However, the shape is not limited to this. In accordance with a characteristic of a material adopted as the semiconductor layer 1, another shape such as a four-sided pyramid, a three-sided pyramid and a circular cone which can be easily produced may be adopted.

As described above, according to the light-emitting device of the Embodiment 2, the projected portions 141 are formed on the upper surface S1 of the semiconductor layer 1 at the spacing A being random. Accordingly, the light which has not been emitted from the recess/projection portion 14 is reflected at various angles. Accordingly, the light-extraction efficiency can be improved.

Embodiment 3

Figure 6:
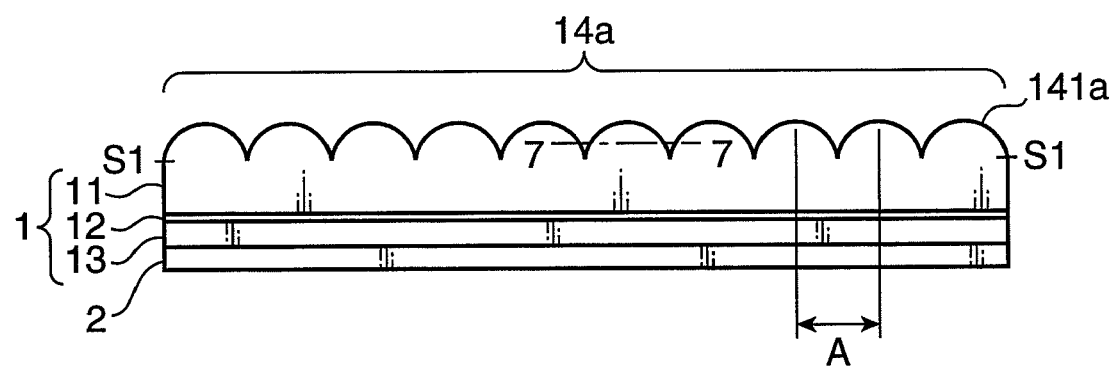
FIG. 6 is a sectional view showing a structure of the light-emitting device according to the Embodiment 3.

Next, a light-emitting device according to Embodiment 3 will be described. FIG. 6 is a sectional view showing a structure of the light-emitting device according to the Embodiment 3. As shown in FIG. 6, the light-emitting device according to the Embodiment 3 is characterized in that a shape of the upper surface S1 of the semiconductor layer 1 is formed to be a shape having a lens action. The lens action is an action of gathering or diffusing light like a convex lens or concave lens does. Further, in the Embodiment 3, arrangements which are the same as those of the Embodiments 1, 2 are provided with the same reference signs, and descriptions thereof will be omitted. More specifically, in the example shown in FIG. 6, a shape of each projected portion 141a constituting a recess/projection portion 14a is formed to be a shape of a convex lens. Further, like the embodiment 1, the spacing A of the projected portions 141a is A≧λ/n, if it is given the wavelength of light emitted from the light-emitting layer 12 being λ and the refractive index of the semiconductor layer 1 being n.

As described above, by forming each of the projected portions 141a to have a shape like a convex lens, distribution of light extracted from the recess/projection portion 14a can be controlled so that a light-emitting device preferably used as a light-emitting device for a lighting equipment can be provided. Further, a shape of the projected portion is not limited to the shape of a convex lens. The shape may be changed favorably in accordance with how distribution of light extracted from the recess/projection portion 14a should be controlled.

Figure 7:
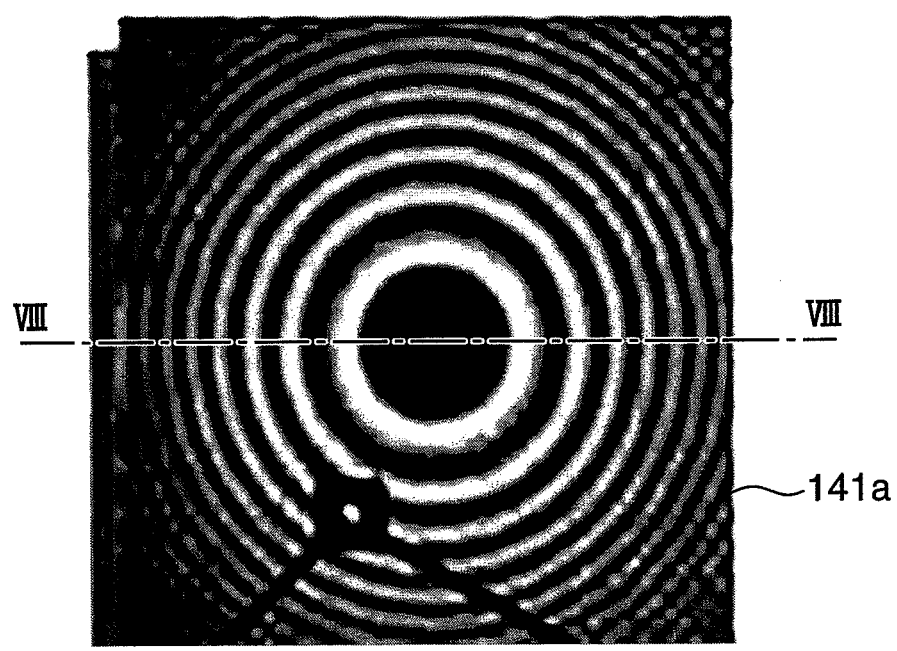
FIG. 7 is a top view showing a projected portion 141a in the case where the projected portion 141a is formed to be a shape of Fresnel lens.
Figure 8:
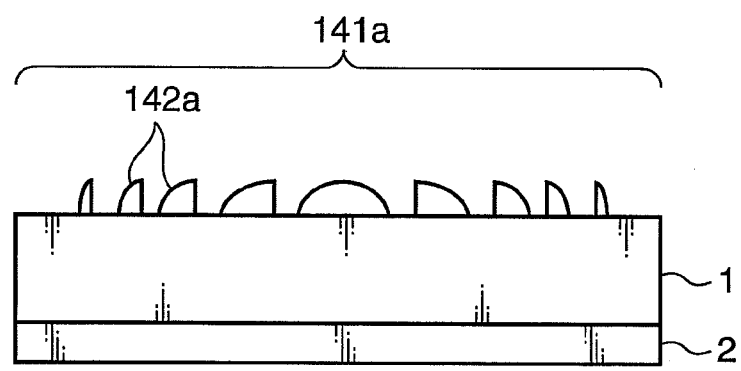
FIG. 8 is a sectional view of the light-emitting device in the case where the projected portion 141a shown in FIG. 7 is taken along a line indicated by reference signs VIII-VIII.

For example, a shape of the projected portion 141a may be formed to be a shape of a Fresnel lens as shown in FIG. 7 in place of the shape of a convex lens shown in FIG. 6. FIG. 7 is a top view showing projected portion 141a in the case where the projected portion 141a is formed to have a shape of a Fresnel lens. FIG. 8 is a sectional view of the light-emitting device in the case where the projected portion 141a shown in FIG. 7 is taken along a line indicated by reference signs VIII-VIII.

Figure 9A:
FIG. 9A is a sectional view showing a detailed structure of the sub-wavelength diffractive lattice in detail.
Figures 9B, 9C:
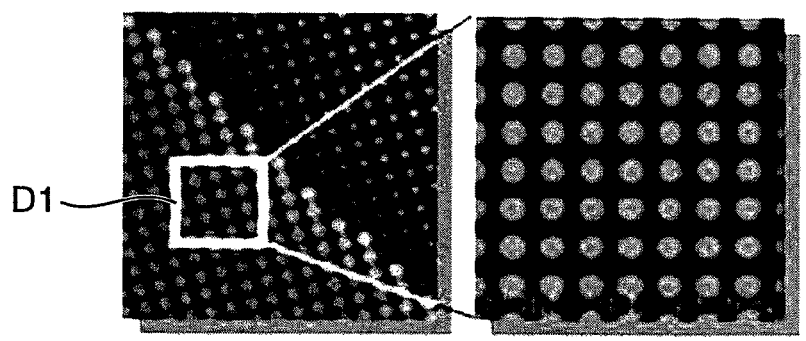
FIG. 9B is a top view of FIG. 9A.
FIG. 9C is an enlarged view of the area D1 of FIG. 9B.

Here, small lens portions 142a constituting the Fresnel lens shown in FIG. 8 may be composed of a sub-wavelength diffractive lattice including a plurality of microscopic cylindrical projected portions 143a each having a different radius as shown in FIG. 9A. FIG. 9A is a view showing a detailed structure of the sub-wavelength diffractive lattice. FIG. 9B is a top view of FIG. 9A. FIG. 9C is an enlarged view of an area D1 of FIG. 9B.

As shown in FIG. 9B, a radius of each projected portion 143a is changed in accordance with tilt of a surface of the small lens portion 142a with respect to a horizontal plane. More specifically, a radius of each projected portion 143a is determined in such a manner that a radius becomes larger as tilt of the surface of each small lens 142a becomes moderate. A radius of the projected portion 143a is smaller than a wavelength in the semiconductor layer 1 of light emitted from the light-emitting layer 12. As described above, even if the Fresnel lens shown in FIG. 8 is composed of the sub-wavelength diffractive lattice shown in FIGS. 9A to 9C, an action which is the same as that of the Fresnel lens can be made.

Figure 10:
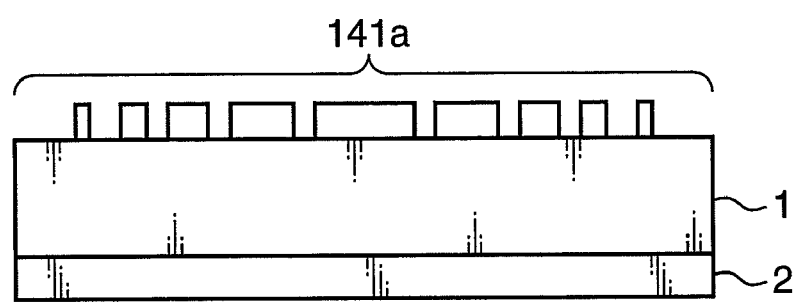
FIG. 10 is a sectional view in the case where the projected portion 141a is composed of a zone plate.

Further, the projected portion 141a shown in FIG. 7 may be composed of a zone plate as shown in FIG. 10. The recess/projection portion 14a shown in the Embodiment 3 can be easily realized by using the known thermal reflow method or nano-print method.

As described above, according to the light-emitting device of the Embodiment 3, a light-emitting device favorable for use in a lighting equipment can be provided since the projected portion 141a has a shape operable to act as a lens action. Further, by forming each projected portion 141a to be a shape of a Fresnel lens, a sub-wavelength diffractive lattice or a zone plate, the thickness of the projected portion 141a does not become large so that a focal length of light transmitted through the projected portion 141a can be controlled.

Embodiment 4

Next, a light-emitting device according to Embodiment 4 will be described. The light-emitting device according to the Embodiment 4 is characterized in that it adopts an alloy mainly including silver (silver alloy) as a member constituting the reflective layer 2 of the Embodiments 1 to 3. Especially in the Embodiment 4, a silver alloy of AgPdCu system is adopted as the reflective layer 2. In view of enhancing the reflectance, it is preferable to adopt Ag as the reflective layer 2. However, Ag does not have good electroconductivity with respect to a GaN and is susceptible to oxidization. Accordingly, it is more preferable to adopt a silver alloy electroconductivity having good electroconductivity with respect to a GaN and not being susceptible to oxidization.

As described above, according to the light-emitting device of the Embodiment 4, a since silver alloy is adopted as the reflective layer 2, the reflective layer 2 has a high reflectance and having good electroconductivity with respect to a GaN. Accordingly, a light-emitting device with high light-extraction efficiency can be provided.

Embodiment 5

Figure 11:
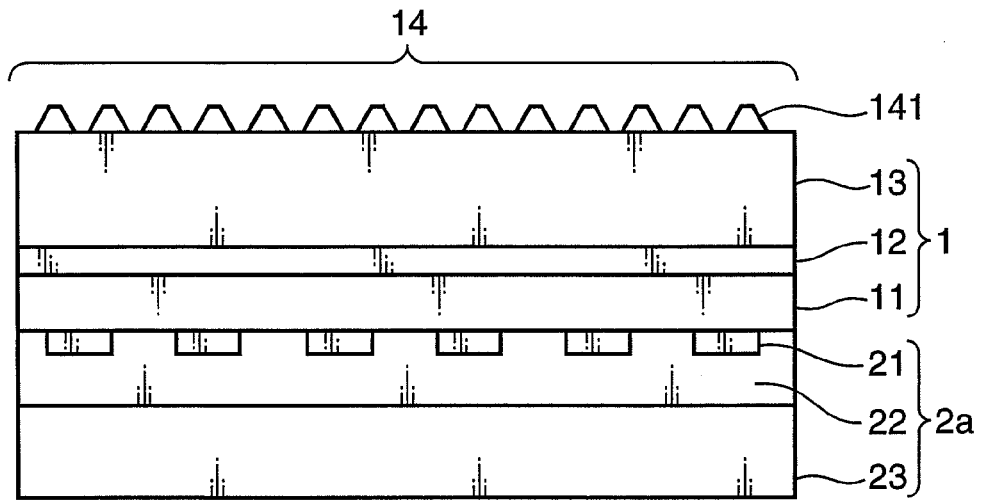
FIG. 11 is a sectional view showing a structure of the light-emitting device according to the Embodiment 5.

Next, a light-emitting device according to Embodiment 5 will be described. FIG. 11 is a sectional view showing a structure of the light-emitting device according to Embodiment 5. As shown in FIG. 11, the light-emitting device according to the Embodiment 5 is characterized in that it adopts a reflective layer 2a as the reflective layer 2 of the light-emitting device according to the Embodiments 1 to 4. The reflective layer 2a includes a platinum layer 21, a conductive oxide layer 22 and a metal layer 23.

As shown in FIG. 11, the light-emitting device includes a semiconductor layer 1 composed of a GaN system material and the reflective layer 2a formed on the surface of the semiconductor layer 1.

The semiconductor layer 1 includes a p-type semiconductor layer 11 formed on a surface of the reflective layer 2a, a light-emitting layer 12 formed on a surface of the p-type semiconductor layer 11 and an n-type semiconductor layer 13 formed on a surface of the light-emitting layer 12. On a surface of the n-type semiconductor layer 13, projected or recessed portions 141 are formed in a predetermined spacing A (period A). The spacing A is longer than a wavelength in the semiconductor layer 1 of light emitted from the light-emitting layer 12. Specifically, the spacing A is A≧λ/n, if it is given a wavelength of light emitted from the light-emitting layer 12 being λ and the refractive index of the semiconductor layer 1 being n. In the example shown in FIG. 11, a surface from which light is emitted is the upper surface of the n-type semiconductor layer 13.

The reflective layer 2a is a layer having a reflectance of 90% or more with respect to a wavelength of light emitted from the light-emitting layer 12. In the present embodiment, the reflective layer 2a includes the platinum layer 21, the conductive oxide layer 22 and the metal layer 23.

The platinum layer 21 is a layer consisting of platinum (Pt) and having a mesh-like shape or an island-like shape in a top view, and is formed on a surface of the p-type semiconductor layer 11 in the semiconductor layer 1. The island-like shape includes, for example, a shape of ellipse (including a circle) and a polygon including a quadrilateral and a hexagon in a top view. The platinum layer 21 is formed to secure electric connection between the p-type semiconductor layer 11 and the conductive oxide layer 22.

The conductive oxide layer 22 is a layer consisting of a metal oxide such as ITO (Indium Tin Oxide) and ZnO having electroconductivity and being transparent with respect to a wavelength of light emitted from the light-emitting layer 12. Since the platinum layer 21 has a mesh-like shape or island-like shape, the conductive oxide layer 22 is formed on a surface of the platinum layer 21 so as to partially come in contact with the p-type semiconductor layer 11 of the semiconductor layer 1. In other words, the conductive oxide layer 22 is formed on the p-type semiconductor layer 11 of the semiconductor layer 1 such that the mesh-like or island-like platinum layer 21 is formed between the p-type semiconductor layer 11 of the semiconductor layer 1 and the conductive oxide layer 22. When the conductive oxide layer 22 is formed between the p-type semiconductor layer 11 of the semiconductor layer 1 and the metal layer 23, a contact resistance is lowered. Accordingly, electric conductivity i.e. carrier injection efficiency is improved.

The metal layer 23 is a layer consisting of metal (including an alloy) such as silver (Ag), a silver alloy containing silver as a primary element, aluminum (Al) or an alloy containing aluminum as a primary element (aluminum alloy). For maintaining a high reflectance in the metal layer 23, it is preferable that an area (aperture ratio) of the conductive oxide layer 22 to be in contact with the semiconductor layer 1 is 80% or more.

In one embodiment, such reflective layer 2a includes a platinum layer 21 having a thickness of 1.5 nm or less, a conductive oxide layer 22 consisting of ITO having a thickness of 5 nm or less and a metal layer 23 consisting of silver having a thickness of 300 nm, for example. Then, though unillustrated, a nickel (Ni) layer as a ground layer having a thickness of 30 nm and a gold (Au) layer having a thickness of 1000 nm are formed under the lower surface of the metal layer 23 of silver to form an electrode pad.

As described above, according to the light-emitting device having such arrangement, the reflective layer 2a including the platinum layer 21, the conductive oxide layer 22 and the metal layer 23 is adopted. Accordingly, the metal layer 23 has a high reflectance and comes in ohmic contact with the p-type semiconductor layer 11 so that a light-emitting device having a high light-extraction efficiency can be provided. For example, in the above-described embodiment, the reflective layer 2a shows a reflectance of about 91.5%. By a synergetic effect with the recess/projection portion 14 formed on the upper surface of the n-type semiconductor layer 13, a light-extraction efficiency of about 60% or more can be expected.

Further, in the above-described embodiment, a p-type dopant consisting of magnesium (Mg) or the like may be added to the p-type semiconductor layer 11 to realize more favorable ohmic contact.

Embodiment 6

Figure 12:
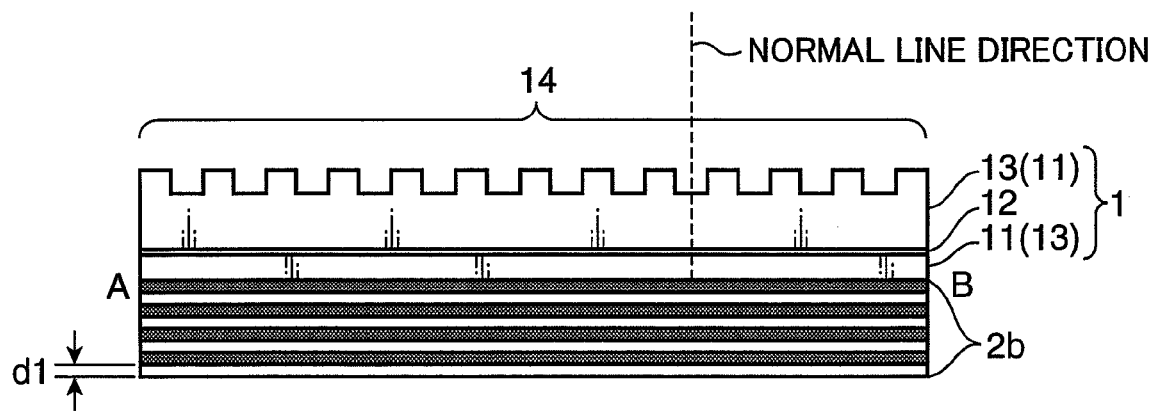
FIG. 12 is a sectional view showing a structure of the light-emitting device according to the Embodiment 6.

Next, a light-emitting device according to Embodiment 6 will be described. FIG. 12 is a sectional view showing a structure of the light-emitting device according to Embodiment 6. As shown in FIG. 12, the light-emitting device according to the Embodiment 6 is characterized in that it adopts a reflective layer 2b including a DBR (distributed bragg reflector) as the reflective layer 2 of the light-emitting device according to the Embodiments 1 to 4. In the Embodiment 6, the arrangements which are the same as those of the Embodiments 1 to 4 are provided with the same reference signs, and descriptions thereof will be omitted. In the present embodiment, the DBR is a reflective mirror composed of a stacked plurality of layers each having a thickness of ¼ of a wavelength in the semiconductor layer 1 of light emitted from the light-emitting layer 12 and having a refractive index different from each other. In the DBR, reflected waves in each layer intensify each other by the Bragg reflection occurred in accordance with an interference effect of light so that a high reflectance can be obtained. It is adopted in the present embodiment a DBR in which fifty pairs of AlGaN/GaN pair layer are layered is adopted. Accordingly, the reflective layer 2 can realize a reflectance of 99% or more. Such DBR can be formed by deposition with an electronic beam (EB).

A DBR can realize a reflectance of almost 100%. However, a known DBR is designed so as to make a reflectance be 100% with respect to light incident in a normal line direction of the AB surface shown in FIG. 12 i.e. light incident in an incident angle of 0 degree. This is because a thickness d1 of each layer constituting the DBR is set to be ¼ of a wavelength of the incident light.

Figure 13B:
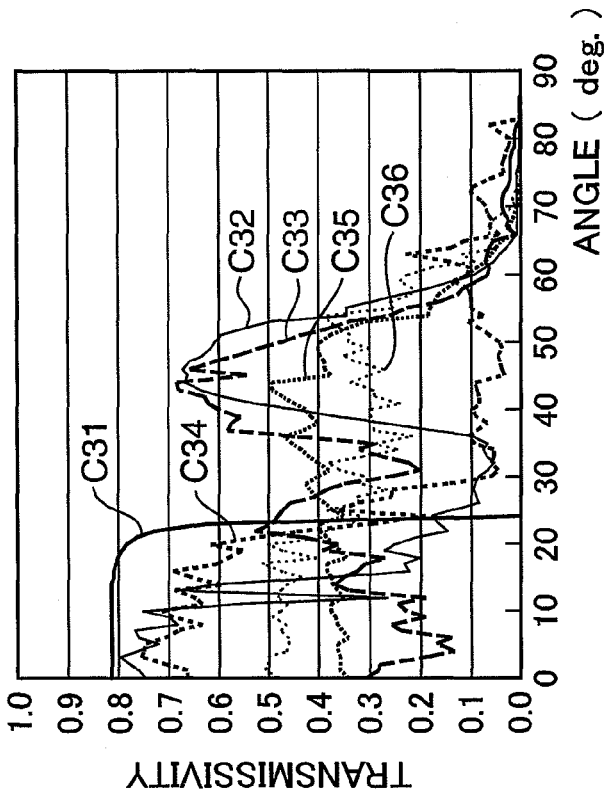
FIG. 13B is a graph showing transmission characteristic according to a shape of the recess/projection portion 14.
Figure 13A:
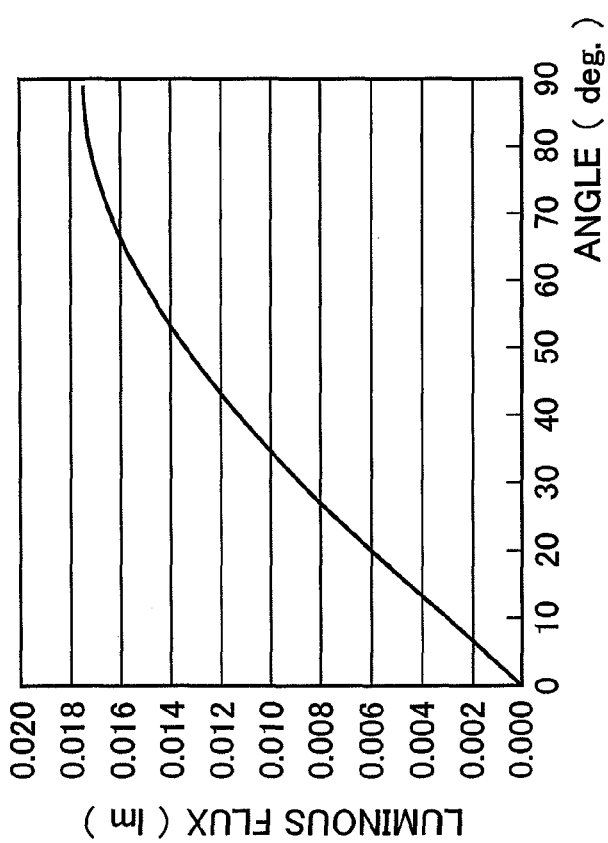
FIG. 13A is a graph showing a light distribution of light emitted from the light-emitting layer 12.

However, as shown in FIG. 13A, the intensity of light increases as an incident angle of light becomes closer from 0 degree to 90 degrees in view of distribution of light emitted from the light-emitting layer 12. Further, as shown in FIG. 13B, a relation between the incident angle and the transmissivity from the recess/projection portion 14 differs in accordance with a shape of the recess/projection portion 14.

FIG. 13A is a graph showing a light distribution of light emitted from the light-emitting layer 12. The vertical axis shows a relative strength of a luminous flux (lm), and the horizontal axis shows an angle (deg). The angle indicates an angle with respect to a normal line direction of light emitted from the light-emitting layer 12. As shown in FIG. 13A, it can be seen that a luminous flux emitted from the light-emitting layer 12 increases as an angle becomes larger.

FIG. 13B is a graph showing transmission characteristic in accordance with a shape of the recess/projection portion 14. The vertical axis shows a transmissivity (light-extraction efficiency) from the recess/projection portion 14, and the horizontal axis shows an incident angle to the upper surface S1. Further, in FIG. 13B, the graph C31 shows the case where a cross-sectional shape of the recess/projection portion 14 is substantially flat. The graph C32 shows the case where a cross-sectional shape of the recess/projection portion 14 is like a triangular wave. The graph C33 shows the case where a cross-sectional shape of the recess/projection portion 14 is like a sinusoidal wave. The graph C34 shows the case where a cross-sectional shape of the recess/projection portion 14 is like a rectangular wave. The graph C35 shows the case where a shape of the recess/projection portion 14 is circular. The graph C36 shows the case where a cross-sectional shape of the recess/projection portion 14 is like a cone.

As shown in FIG. 13B, it can be seen that the transmission characteristic of light greatly differ in accordance with a shape of the recess/projection portion 14. Here, the light-extraction efficiency for each time of transmission can be expressed with the following formula.

$$\text{light-extraction efficiency } \eta = \int (\text{transmissivity}(\theta)^*\text{light distribution}(\theta))d\theta$$

Therefore, amount of light actually extracted from the recess/projection portion 14 corresponds to an area where the graph shown in FIG. 13A overlaps with any one of the graphs C31 to C36.

Figure 14:
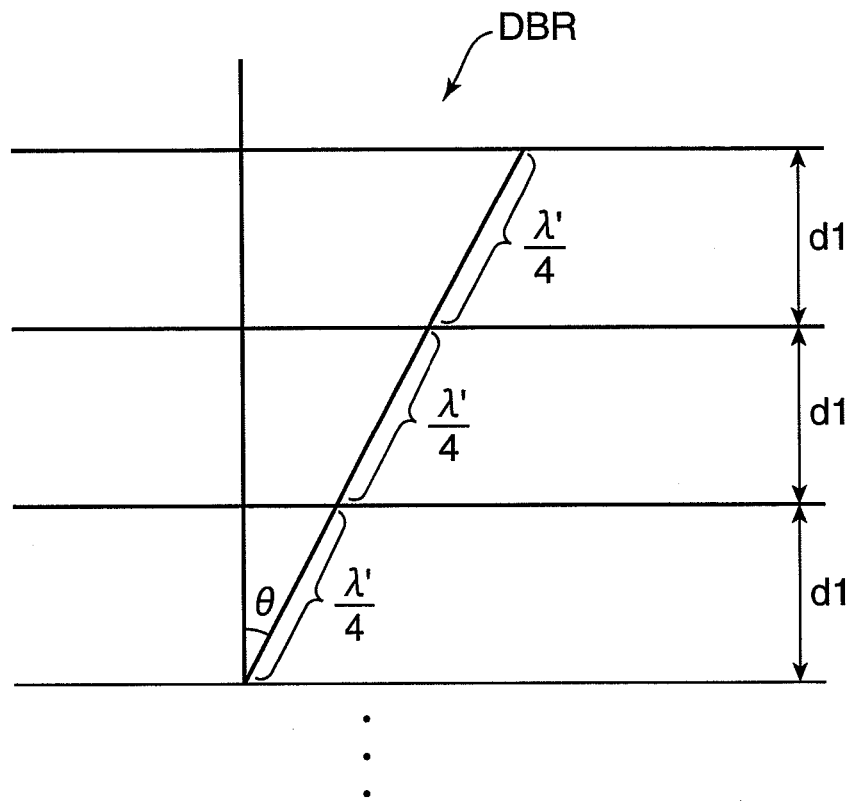
FIG. 14 is a view for describing the thickness of a DBR layer.

For example, in the graph C34 of FIG. 13B showing a rectangular wave, the DBR may be designed such that a reflectance of the DBR becomes 99% or more a an angle of 60 degrees, which is an intermediate angle within a range between 30 degrees and 90 degrees with a high luminous flux intensity and low transmissivity. It can be realized by setting a thickness d1 of the DBR such that a length of each layer on a straight line in angle (θ=60 degrees) with respect to the normal line direction becomes ¼ of a wavelength λ' in the semiconductor layer 1 of light emitted from the light-emitting layer 12, as shown in FIG. 14. Accordingly, a transmissivity in a range from 30 degrees to 90 degrees increases so that the light-extraction efficiency can be increased.

Further, in the graph C32 in FIG. 13B showing the triangular wave, the DBR should be designed such that the reflectance of light at around 70 degrees with low transmissivity becomes 99% or more. This is realized by setting a thickness d1 of the DBR such that a length of each layer in a straight line in an angle (θ=70 degrees) with respect to a normal line direction becomes ¼ of the wavelength λ' in the semiconductor layer 1 of light emitted from the light-emitting layer 12, as shown in FIG. 14. Further, since the transmissivity around an angle of 40 degrees is also low in the graph C32, it may be considered to design the DBR such that the reflectance of light around an angle of 40 degrees becomes high. However, as shown in FIG. 13A, a value of luminous flux is higher at around an angle around 70 degrees than at an angle around 40 degrees. Accordingly, it is preferable to design the DBR such that the reflectance at an angle around 70 degrees becomes high to make the light-extraction efficiency be high.

As described above, according to the light-emitting device of the Embodiment 6, the reflective layer 2b is composed of the DBR. Accordingly, the reflectance of the reflective layer 2b is raised, thereby the light-extraction efficiency is further raised. Further, since the thickness of the DBR is set such that the reflectance in the DBR in an angle with a low transmissivity is raised due to the transmission characteristic determined in accordance with a shape of the recess/projection portion 14, loss of light which has not passing through in one time but multiply reflected is reduced, thereby the light-extraction efficiency is raised.

Embodiment 7

Figure 15:
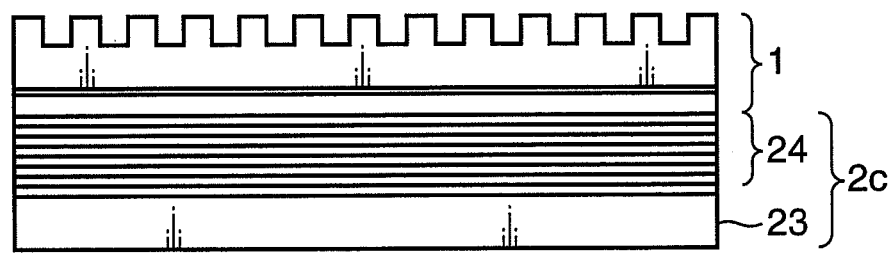
FIG. 15 is a sectional view for showing a structure of the light-emitting device according to the Embodiment 7.

Next, a light-emitting device according to Embodiment 7 will be described. FIG. 15 is a sectional view showing a structure of the light-emitting device according to the Embodiment 7. As shown in FIG. 15, the light-emitting device according to the Embodiment 7 is characterized in that it adopts a reflective layer 2c as the reflective layer 2 of the light emitting devices according to Embodiments 1 to 4. The reflective layer 2c includes a metal layer 23 consisting of aluminum, silver or a silver alloy and a DBR 24 formed on the metal layer 23. A semiconductor layer 1 is formed on the DBR 24 in the reflective layer 2c. In other words, the light-emitting device according to the Embodiment 7 has an arrangement where a metal layer is further provided under the lower surface of the light-emitting device according to the Embodiment 6. In the Embodiment 7, arrangements which are the same as those of the Embodiments 1 to 4 are provided with the same reference signs respectively, and descriptions of those will be omitted.

Figure 16A:
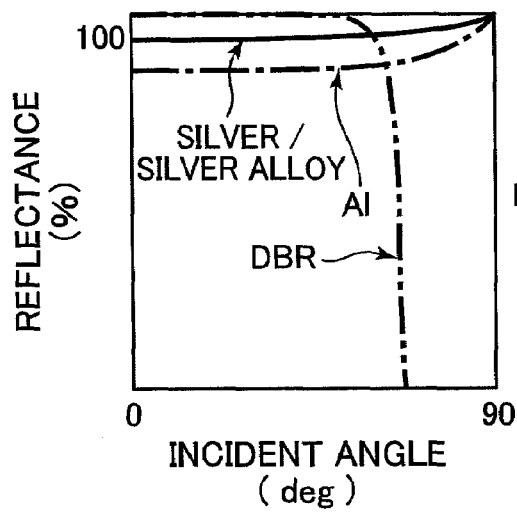
FIG. 16A is a graph showing reflectance characteristic between silver or silver alloy and a DBR, and reflectance characteristic between aluminum and a DBR.

FIG. 16 shows graphs of reflectance characteristics showing a relation between the incident angle and reflectance in the case of silver or a silver alloy (silver/silver alloy) and a DBR, and a relation between the incident angle and reflectance in the case of aluminum (Al) and a DBR. The vertical axis of FIG. 16 shows the reflectance (%), and the horizontal axis shows the incident angle. In FIG. 16A, the solid line shows the characteristics of silver or a silver alloy, and a one-dot chain line shows reflectance characteristics of aluminum. Further, the two-dotted chain line shows the reflectance characteristics of a DBR. As shown in FIG. 16A, the reflectance of silver or a silver alloy and the reflectance of aluminum are lower than that of a DBR in a range of the incident angles between 0 degree and about 75 degrees. However, the reflectance becomes higher than that of the DBR in a range beyond about 75 degrees. The reflectance of silver or a silver alloy is higher than the reflectance of aluminum.

Figure 16B:
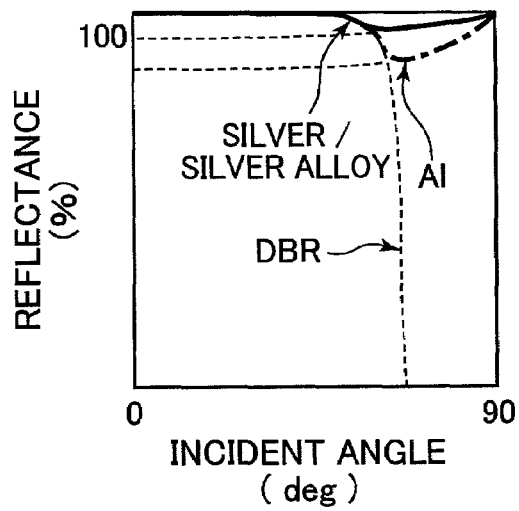
FIG. 16B is a graph showing reflectance characteristics of the light-emitting device shown in FIG. 15.

Thus, if the reflective layer 2c is arranged as shown in FIG. 15, the reflective layer 2c would have the reflectance characteristics having both the reflectance characteristics of a DBR and the reflectance characteristics of silver or a silver alloy as shown in FIG. 16B. Alternatively, the reflective layer 2c would have the reflectance characteristics having both the reflectance characteristics of a DBR and the reflectance characteristics of aluminum as shown in FIG. 16B.

As a result, the reflective layer 2c having a high reflectance with respect to all of the incident angles can be arranged. Generally, a DBR is composed of a plurality of pair layers. However, as a special case, the number of layers of the DBR may be one layer in the case of the reflective layer 2c where the high-reflectance metal layer and DBR are layered.

Figure 17:
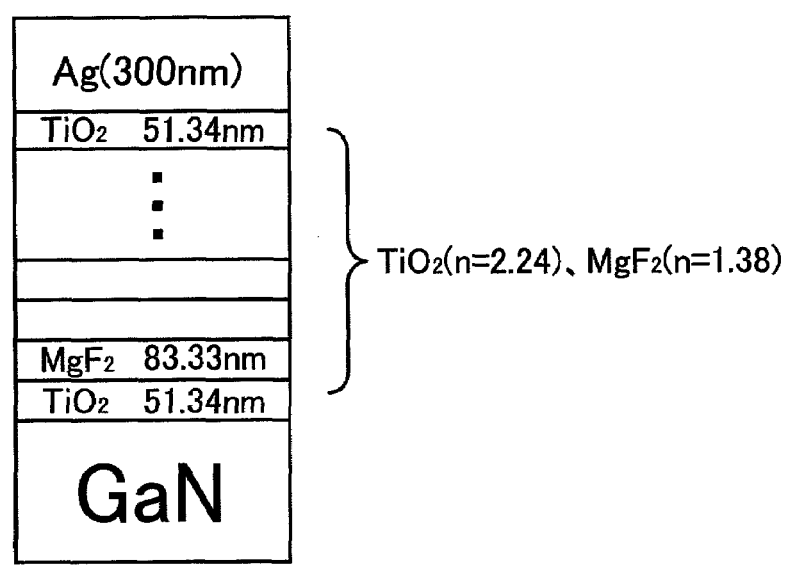
FIG. 17 is a view showing a structure of a reflective layer 2c used in a simulation.
Figure 18:
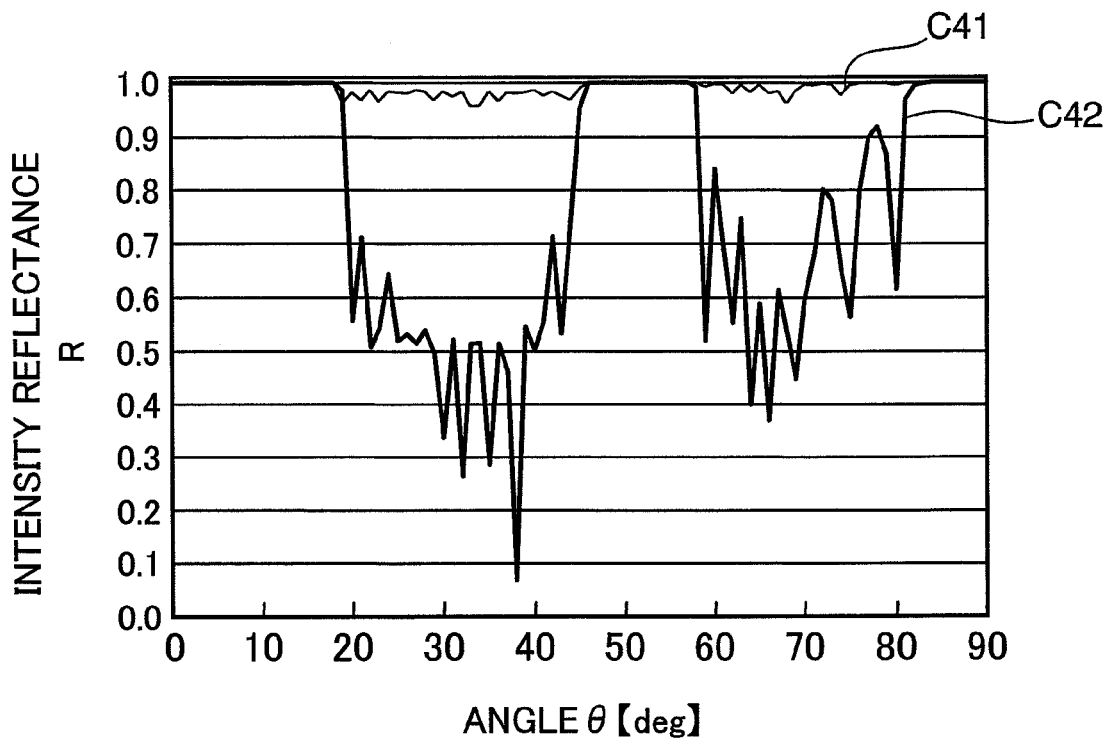
FIG. 18 shows the result of the simulation showing an angular dependency of reflectance in the reflective layer 2c.

Concerning an angular dependency of the reflectance in such reflective layer 2c, a simulation was performed FIG. 17 is a figure showing a structure of the reflective layer 2c used in the simulation. FIG. 18 is a simulation result showing an angular dependency of the reflectance in the reflective layer 2c. The vertical axis of FIG. 18 shows the intensity reflectance, and the horizontal axis shows the incident angle from a GaN to a DBR. C41 shows the reflectance in the case of the reflective layer 2c including the DBR 24 and the metal layer 23 consisting of silver, and C42 shows the reflectance in the case of the reflective layer 2b including a DBR.

As shown in FIG. 17, in the reflective layer 2c used in the simulation, the DBR 24 is layered on a GaN layer as the p-type semiconductor layer 11, and the metal layer 23 consisting of silver having a thickness of 300 nm is layered on the DBR 24. In the DBR 24, fifteen layers of pair layers including $TiO_2$ and $MgF_2$ are layered. Further, $TiO_2$ is layered thereon. To make the thickness be ¼n of the wavelength λ (=460 nm), $TiO_2$ has a refractive index of 2.24 and a thickness of 51.34 nm, and $MgF_2$ has a refractive index of 1.38 and a thickness of 83.33 nm. A complex refractive index of silver is 0.055-3.32 i (i is an imaginary unit.)

As can be seen from FIG. 18, in the case where the reflective layer 2 is the reflective layer 2b consisting of a DBR, lowering of reflectance can be seen in ranges of incident angles between about 17 degrees and about 50 degrees and between about 60 degrees and about 90 degrees. On the other hand, in the case where the reflective layer 2 is the reflective layer 2c consisting of a DBR and a metal layer of silver, lowering of reflectance cannot be seen in a whole range of incident angles between 0 degree and 90 degrees, and the reflectance of 95% or more is maintained.

As described above, according to the light-emitting device of the Embodiment 7, the reflective layer 2c is composed of the DBR 24 and the metal layer 23. Accordingly, the layers compensate for each other, and the reflectance of the reflective layer 2c is raised in a wide range of incident angles between 0 degree and 90 degrees. Accordingly, the light-extraction efficiency is further raised.

Embodiment 8

Figure 19:
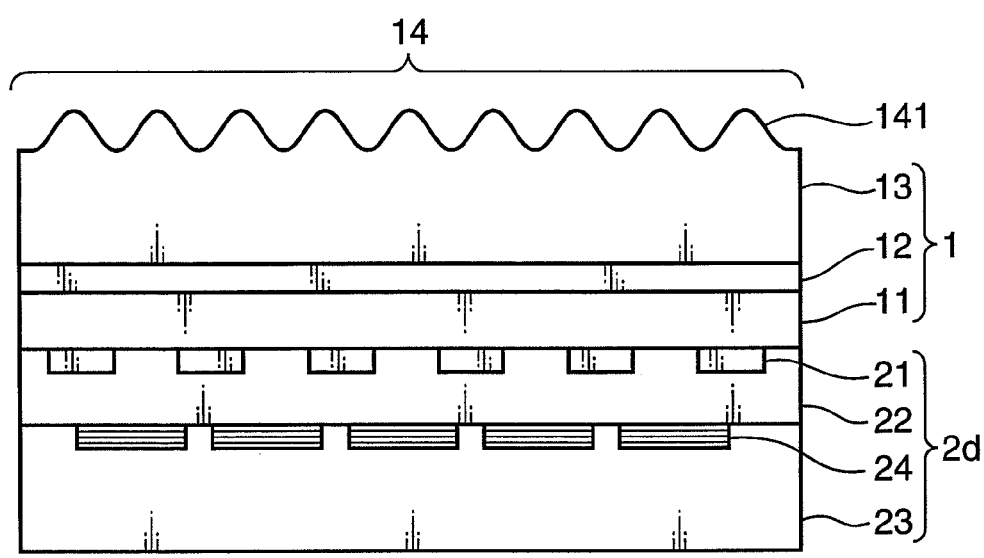
FIG. 19 is a sectional view showing a structure of the light-emitting device according to the Embodiment 8.

Next, a light-emitting device according to Embodiment 8 will be described. FIG. 19 is a sectional view showing a structure of the light-emitting device according to Embodiment 8. As shown in FIG. 19, the light-emitting device according to the Embodiment 8 is characterized in that it adopts a reflective layer 2d as the reflective layer 2 of the light-emitting devices according to the Embodiments 1 to 4. The reflective layer 2d includes a platinum layer 21, a conductive oxide layer 22, a metal layer 23 and a DBR 24. The semiconductor layer 1 is formed on the platinum layer 21 of the reflective layer 2d. In the Embodiment 8, the arrangements which are the same as those of the Embodiments 1 to 4 are provided with the same reference signs, and descriptions of those will be omitted.

The reflective layer 2d is a layer having a reflectance of 90% or more with respect to the wavelength of light emitted from the light-emitting layer 12. In the present embodiment, the reflective layer 2d is provided with the platinum layer 21, the conductive oxide layer 22, the metal layer 23 and the DBR 24. The platinum layer 21 and the conductive oxide layer 22 are the same as the platinum layer 21 and the conductive oxide layer 22 of the light-emitting device according to Embodiment 5. Accordingly, descriptions of those will be omitted.

The DBR 24 is similar to the DBR 24 of the light-emitting device according to the Embodiment 7, and it is formed to have a mesh-like shape or an island-like shape in a top view and formed under the lower surface of the conductive oxide layer 22 in the present Embodiment 8. The island-like shape includes, for example, polygons such as an ellipse (including a circle), a quadrilateral and a hexagon in a top view. Since such DBR 24 is formed to have a mesh-like shape or an island-like shape, an electric conduction between the conductive oxide layer 22 and the metal layer 23 can be secured even in the case where the electroconductivity of the DBR 24 is low. Further, in the case where the DBR 24 has enough electroconductivity to secure the electric conduction between the conductive oxide layer 22 and the metal layer 23, the DBR 24 may be formed on a whole boundary surface between the conductive oxide layer 22 and the metal layer 23.

The metal layer 23 is similar to the metal layer 23 of the light-emitting device according to Embodiment 7. In the present Embodiment 8, since the DBR 24 has a mesh-like shape or an island-like shape, the metal layer 23 is formed under the lower surface of the DBR 24 so as to partially come in contact with the conductive oxide layer 22. In other words, the metal layer 23 is formed under the lower surface of the conductive oxide layer 22 such that the mesh-like or island-like DBR 24 is formed between the conductive oxide layer 22 and the metal layer 23.

In one embodiment, such reflective layer 2d includes the platinum layer 21 having a thickness of 1.5 nm or less, the conductive oxide layer 22 of ITO having a thickness of 5 nm or less, the metal layer 23 of silver having a thickness of 300 nm and the DBR 24. The DBR 24 is a reflective mirror including fifteen pairs of $TiO_2$ and $MgF_2$ and the final layer of $TiO_2$. Further, though it is not illustrated in the figures, a nickel (Ni) layer having a thickness of 30 nm and a gold (Au) layer having a thickness of 1000 nm are formed under the lower surface of the metal layer 23 of silver to form an electrode pad.

Figure 20:
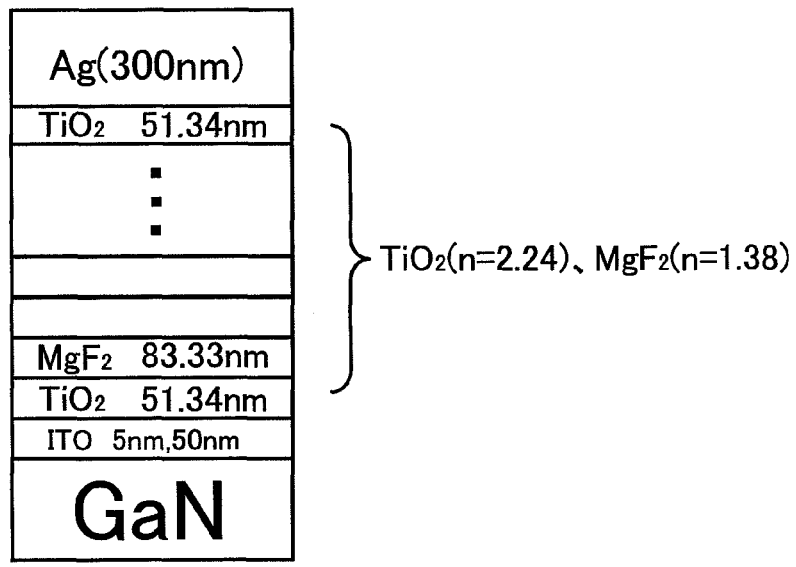
FIG. 20 is a view showing a structure of a reflective layer 2d used in a simulation.
Figure 21:
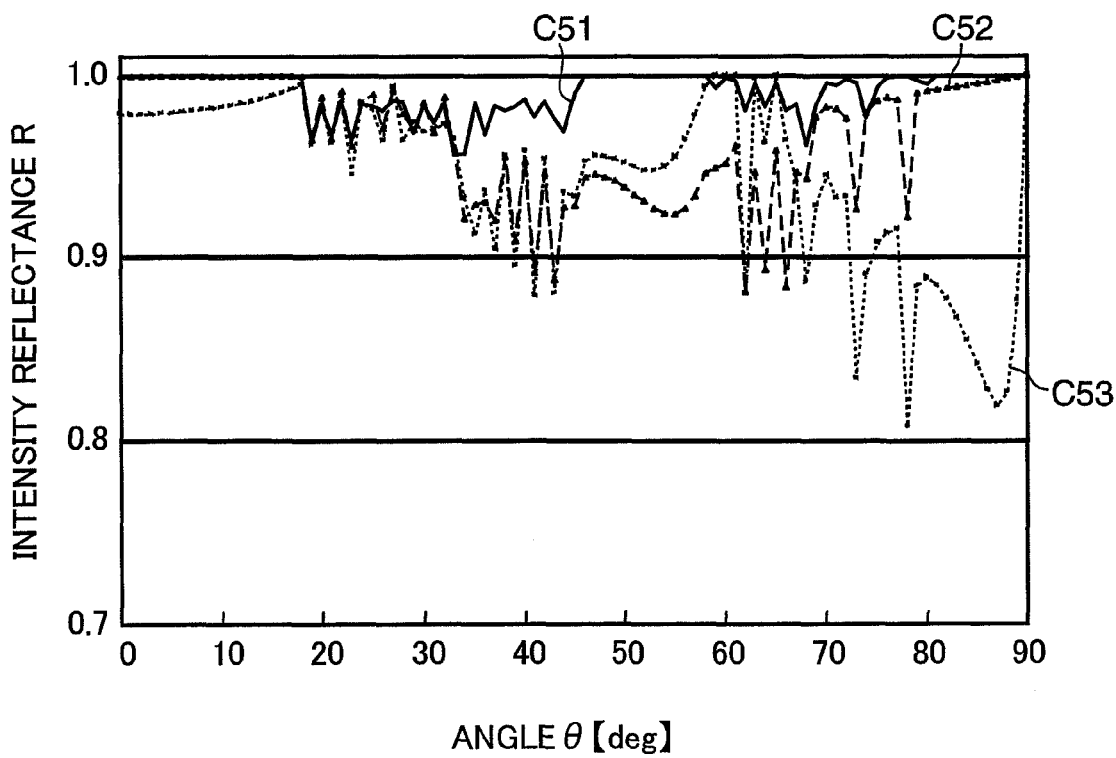
FIG. 21 shows the result of the simulation showing an angular dependency of a reflectance in the reflective layer 2d.

Concerning the angular dependency of the reflectance in such reflective layer 2d, a simulation was performed. FIG. 20 is a figure showing a structure of the reflective layer 2d used in the simulation. FIG. 21 is a simulation result showing the angular dependency of the reflectance in the reflective layer 2d. The vertical axis of FIG. 21 shows the intensity reflectance, and the horizontal axis shows the incident angle from a GaN to a DBR. C51 shows the reflectance in the case of the reflective layer 2c including the DBR 24 and the metal layer 23 consisting of silver, and C52 and C53 shows the reflectance in the case of the reflective layer 2d including the conductive oxide layer 22 of ITO and the metal layer 23 consisting of the DBR 24 and silver. C52 shows the case where a thickness of ITO is 5 nm, and shows the case where a thickness of ITO is 50 nm.

As shown in FIG. 20, in the reflective layer 2*d* used in the simulation, the conductive oxide layer 22 of ITO is formed on a GaN layer as the p-type semiconductor layer 11, the DBR 24 is formed on the conductive oxide layer 22, and the metal layer consisting of silver having a thickness of 300 nm is formed on the DBR 24. The cases where the ITO has a thickness of 5 nm and 50 nm are simulated respectively, and a complex refractive index is 2.3-0.008 i. In the DBR 24, fifteen layers of pair layers including $TiO_2$ and $MgF_2$ are layered. Further, $TiO_2$ is layered thereon. To make the thickness be ¼n of the wavelength λ (=460 nm), $TiO_2$ has a refractive index of 2.24 and a thickness of 51.34 nm. In other words, the reflective layer 2*d* shown in FIG. 20 is so arranged that ITO is formed between a GaN and a DBR, as compared with the reflective layer 2*c* shown in FIG. 17.

As can be seen from FIG. 21, in the case where the reflective layer 2 is the reflective layer 2*d* consisting of an ITO, the reflectance is slightly lowered as compared to the reflective layer 2*c* of a reflective layer 2 not including ITO since the ITO absorbs light. However, a favorable reflectance is maintained in a whole range of incident angles between 0 degree and 90 degrees. As the thickness of ITO becomes thinner, the reflectance as a whole becomes more favorable. Especially, in the case where a thickness of ITO is 5 nm, the reflectance of about 90% or more is maintained in almost whole range of incident angles between 0 degree and 90 degrees. Further, even in the case where ITO has a thickness of 50 nm, the reflectance of almost 90% or more is maintained in a range of incident angles between 0 degree and about 70 degrees.

As described above, according to the light-emitting device having such arrangement, the reflective layer 2*d* is adopted which includes the platinum layer 21, the conductive oxide layer 22, the metal layer 23 and the DBR 24. Accordingly, the reflectance of the reflective layer 2*d* is raised in a wide range of incident angles between 0 degree and 90 degrees, and the reflective layer 2*d* comes in ohmic contact with the p-type semiconductor layer 11. Accordingly, the light-emitting device having higher light-extraction efficiency can be provided.

Further, in the above-described embodiment, the DBR 24 may be a chirp DBR in which the thickness and refractive index of each pair layer constituting a DBR gradually changes. The chirp DBR structure reduces rippling of reflectance which is a partial lowering of reflectance occurred in a predetermined wavelength band and angle band of light incident to a DBR structure in the DBR, and improves the reflectance as a whole. In the case of using the reflective layer 2*d*, the number of layers of DBR may be one layer.

Embodiment 9

Figure 22:
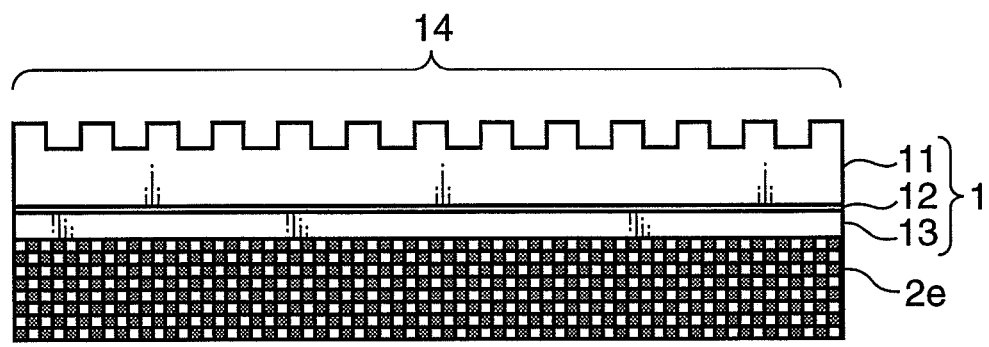
FIG. 22 is a sectional view showing a structure of the light-emitting device according to the Embodiment 9.

Next, a light-emitting device according to Embodiment 9 will be described. FIG. 22 is a sectional view showing a structure of the light-emitting device according to the Embodiment 9. The light-emitting device according to the Embodiment 9 is characterized in that a photonic crystal is adopted as a reflective layer 2*e*. The photonic crystal can realize the reflectance of almost 100% with respect to almost all of incident angles. In the Embodiment 9, the arrangements which are the same as those of the Embodiments 1 to 4 are provided with the same reference signs, and descriptions of those will be omitted.

Figure 23:
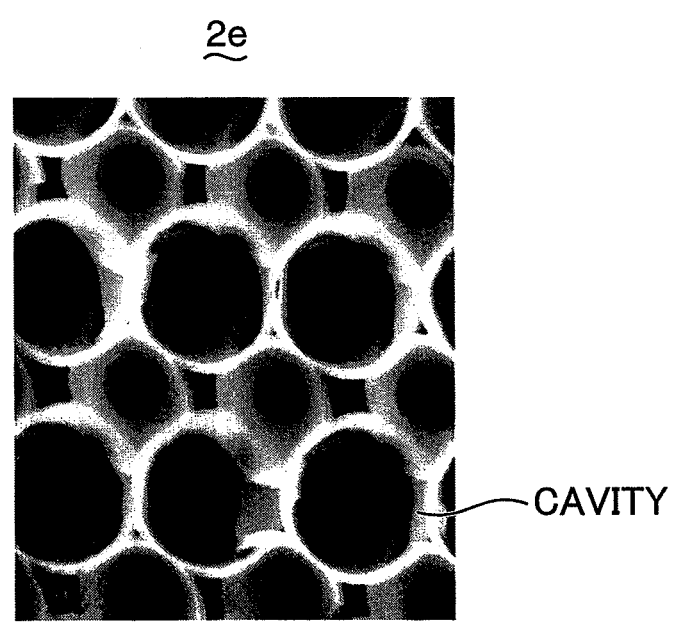
FIG. 23 is an enlarged view of a reflective layer 2e in the case where a photonic crystal having an inverse opal structure is adopted as a photonic crystal.

FIG. 23 is an enlarged view of the reflective layer 2*e* in the case where the photonic crystal having an inverse opal structure is adopted as a photonic crystal. As shown in FIG. 23, a three-dimensional photonic crystal is characterized in that cavities arranged like a plurality of bubbles each having a spherical shape are included. A pitch of the cavities has a length which is about one-half of the wavelength in the semiconductor layer 1 of light emitted from the light-emitting layer 12. More specifically, if a GaN is adopted as the semiconductor layer 1, and light having a wavelength of 460 nm is emitted from the light-emitting layer 12, since the refractive index of a GaN is 2.5, it is preferable to set the pitch of cavities to be (460/2.5)*(½)=about 100 nm.

The photonic crystal having the inverse-opal structure may be easily formed by a known inverse-opal method. In the inverse-opal method, microparticles corresponding to cavities are layered at first. Next, the layered microparticles are soaked in an organic solvent. Then, the organic solvent is sintered and carbonized. Thereafter, the microparticles are dissolved. Thereby, the inverse-opal structure is formed. Since carbon has electroconductivity, the photonic crystal can be used as an electrode without forming a separate electrode.

Figure 24:
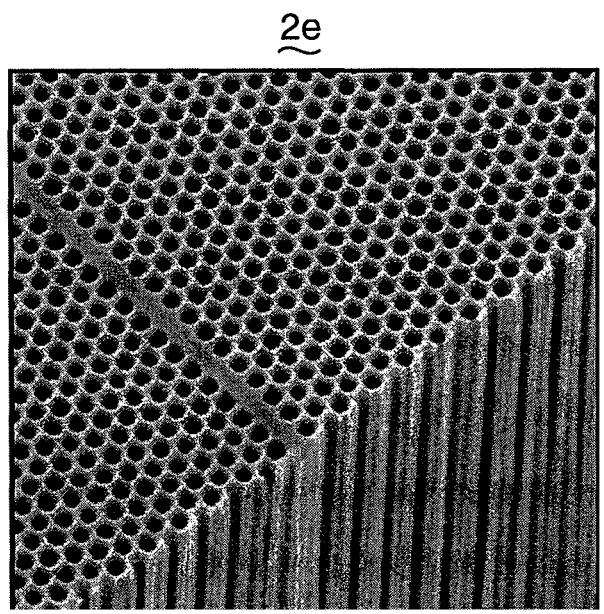
FIG. 24 is a sectional view of a porous Si photonic crystal.

Further, in the embodiment 9, a porous Si photonic crystal (two-dimensional photonic crystal) may be adopted as a photonic crystal adopted in the reflective layer 2*e*. FIG. 24 is a sectional view showing a porous Si photonic crystal. As shown in FIG. 24, the two-dimensional photonic crystal has a structure where pipe-like cavities are arranged in a matrix. The semiconductor layer 1 is layered on the porous Si photonic crystal so that a direction perpendicular to a longitudinal direction of a cavity on the pipe becomes parallel to the upper surface S1 of the semiconductor layer 1.

The light-emitting device may be formed by bonding the porous Si photonic crystal and a GaN. However, the light-emitting device may also be formed by growing a GaN with the porous Si photonic crystal as a growing substrate. By forming the light-emitting device in such a manner, a step of bonding the porous Si photonic crystal and a GaN is omitted, and quality of GaN can be improved, thereby quantum efficiency inside the light-emitting device is improved.

The porous Si photonic crystal has no photonic band with respect to a longitudinal direction of a cavity i.e. a normal direction. Accordingly, the reflectance is slightly weakened. However, the porous Si photonic crystal has a photonic band in an oblique direction with respect to the normal line direction. Accordingly high reflectance is realized with respect to light in this direction. Further, since the porous Si photonic crystal has electroconductivity, it may be directly used as an electrode.

Figure 25:
FIG. 25 is an enlarged view of a photonic crystal formed by an angle deposition method.

Further, in the Embodiment 9, a photonic crystal which is formed by a glancing angle deposition (GLAD) may be adopted as a photonic crystal adopted in the reflective layer 2*e*. FIG. 25 is an enlarged view showing a photonic crystal formed by a glancing angle deposition. The glancing angle deposition is a method of rotating a slanted growing substrate in a predetermined period to grow the photonic crystal to be spiral on the growing substrate.

As described above, according to the light-emitting device according to the Embodiment 9, the reflective layer 2*e* composed of a photonic crystal is adopted. Accordingly, the reflective layer 2*e* with high reflectance with respect to any incident angle can be realized, thereby raising the light-extraction efficiency.

Embodiment 10

Figure 26:
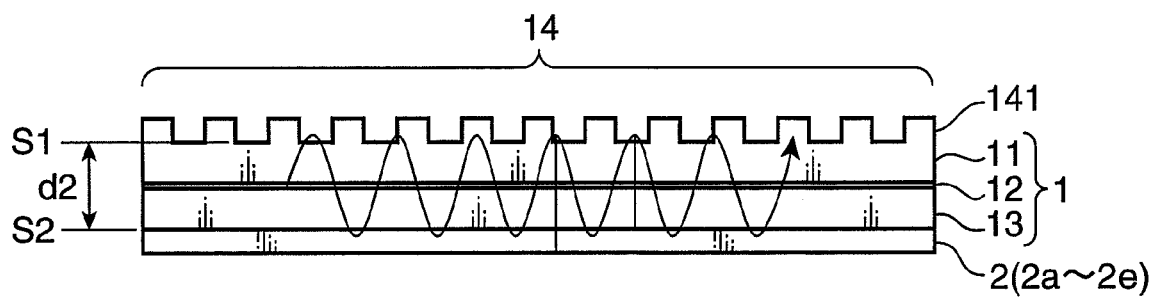
FIG. 26 is a sectional view showing a structure of the light-emitting device according to the Embodiment 10.
Figure 27:
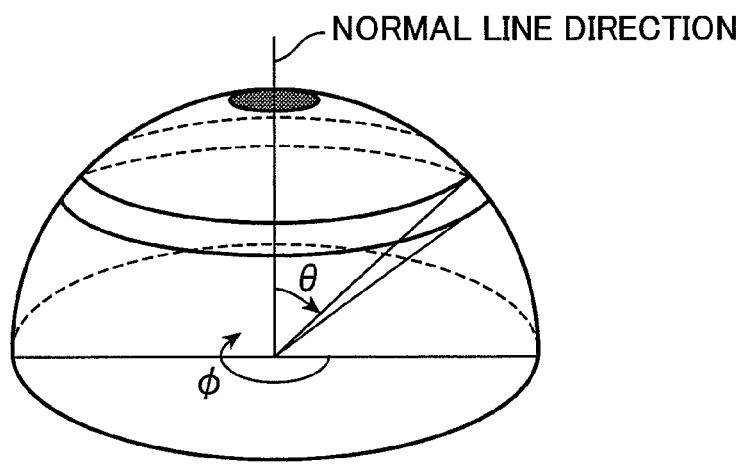
FIG. 27 is a view in three dimensions showing a light distribution of a light emitted from the light-emitting layer 12.

Next, a light-emitting device according to Embodiment 10 will be described. FIG. 26 is a sectional view showing a structure of the light-emitting device according to Embodiment 10. The light-emitting device according to Embodiment 10 is characterized in that the thickness of the semiconductor layer 1 i.e. a distance d2 between the surface S1 including the bottom portion of the recess/projection portion 14 of the semiconductor layer land the lower surface S2 is set to be within several folds larger than the wavelength. In the Embodiment 10, the arrangements which are the same as those of the Embodiments 1 to 9 are provided with the same reference signs, and their descriptions will be omitted. FIG. 27 is a figure showing in three dimensions light distribution of light emitted from the light-emitting layer 12. As shown in FIG. 27, most part of light emitted from the light-emitting layer 12 proceeds in a normal direction as shown in black in the figure. However, since the upper surface of the projected portion 141 is perpendicular to the normal line direction, there is likelihood that light in the normal line direction is not affected by an angle-changing action by the recess/projection portion 14.

Therefore, the distance d2 is set to be several folds larger, preferably 1 to 5 times larger, than or the same as the wavelength of light emitted from the light-emitting layer 12. Accordingly, light in the normal line direction is also affected by the angle-changing action by the recess/projection portion 14, thereby raising the light-extraction efficiency. Specifically, if it is given the wavelength of light emitted from the light-emitting layer 12 being 460 nm and the refractive index of the semiconductor layer 1 being 2.5, it is preferable to set the distance d2 be within 180 nm to 1000 nm.

As described above, according to the light-emitting device of the Embodiment 10, the distance d2 is set to be several folds larger than or substantially the same as the wavelength, the light-extraction efficiency can be raised further.

Embodiment 11

Figure 28A:
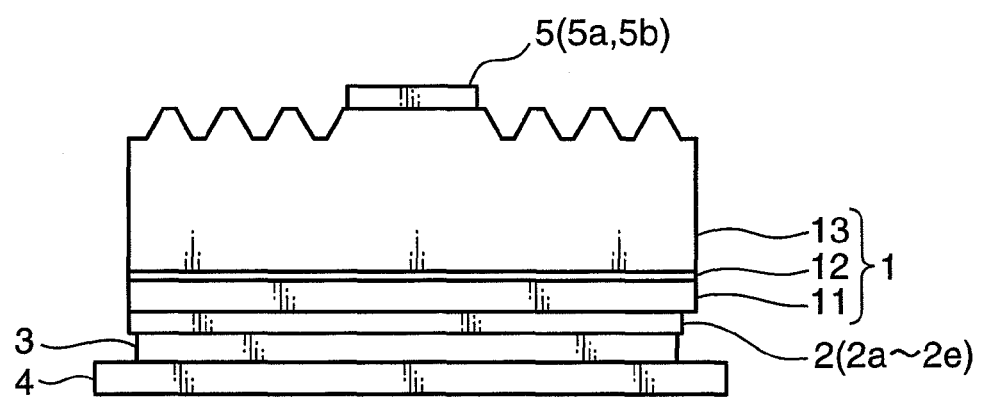
FIGS. 28A and 28B are sectional views showing structures of light-emitting devices according to the Embodiment 11.
Figure 28B:
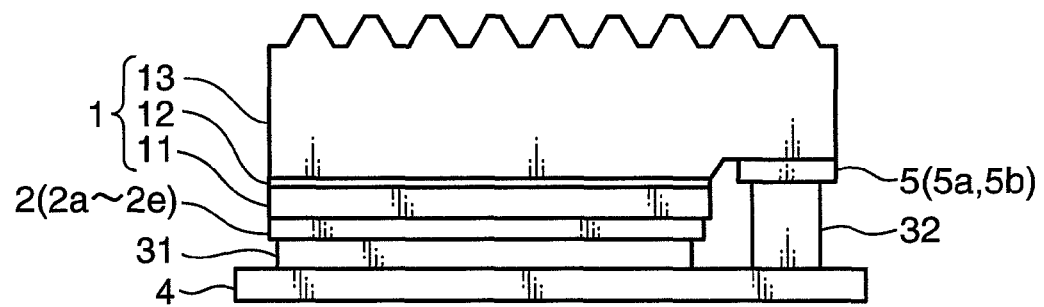

Next, a light-emitting device according to Embodiment 11 will be described. FIG. 28 is a sectional view showing a structure of the light-emitting device according to the Embodiment 11. FIG. 28A shows the case where the light-emitting device is a vertical type. FIG. 28B shows the case where the light-emitting device is a flip-chip type. The light-emitting device according to Embodiment 11 is characterized in that the light-emitting devices according to Embodiments 1 to 10 are provided with a p-type electrode and an n-type electrode for supplying electric power to the light-emitting layer 12 of the semiconductor layer 1. Further, a high-reflectance electrode is adopted as the n-type electrode. In the Embodiment 11, the arrangements which are same as those of the Embodiments 1 to 10 are provided with the same reference signs, and their descriptions will be omitted.

In the case of supplying electric power to the light-emitting layer 12 of the semiconductor layer 1, there are two types, the vertical type and the flip-chip type. In the vertical type, a pair of p-type electrode and n-type electrode is arranged so as to be placed on opposite sides of the light-emitting layer 12 and facing each other. In the flip-chip type (hereinafter, abbreviated as "FC type"), a pair of p-type electrode and n-type electrode are arranged on the same side with respect to the light-emitting layer 12.

As shown in FIG. 28A for example, in the vertical-type light-emitting device, the reflective layer 2 (2a to 2e) of the Embodiments 1 to 10 is a p-type electrode. The n-type electrode 5 is formed on the upper surface of the n-type semiconductor layer 13 in the semiconductor layer 1, and the reflective layer 2 (2a to 2e) of the p-type electrode and the n-type electrode 5 are arranged so as to be placed on the opposite sides of the light-emitting layer 12 and facing each other. In the vertical-type light-emitting device, a wired metal layer 3 for applying positive voltage (+voltage) to the reflective layer 2 (2a to 2e) of the p-type electrode is formed on the lower surface of the reflective layer 2 (2a to 2e), and a support layer 4 for supporting the semiconductor layer 1, the reflective layer 2 (2a to 2e) and the wired metal layer 3 is formed in the lower surface of the wired metal layer 3.

Further, in the FC-type light-emitting device, the reflective layer 2 (2a to 2e) of the light-emitting device according to Embodiments 1 to 10 is a p-type electrode as shown in FIG. 28B. An exposed surface is formed by removing the light-emitting layer 12, the p-type semiconductor layer 11 and the reflective layer 2 (2a to 2e) such that the n-type semiconductor layer 13 in the semiconductor layer 1 faces outside on the side where the reflective layer 2 (2a to 2e) is formed (or the n-type semiconductor layer 13, the light-emitting layer 12 and the p-type semiconductor layer 11 are formed such that such exposed surface is formed, and the reflective layer 2 (2a to 2e) is formed under the lower surface of the p-type semiconductor layer 11). The n-type electrode 5 is formed on the exposed surface, and the p-type electrode and the n-type electrode are arranged on the same side with respect to the light-emitting layer 12. The FC-type light-emitting device has a wired metal layer 31 formed in the lower surface of the reflective layer 2 (2a to 2e) for applying a positive voltage (+voltage) to the reflective layer 2 (2a to 2e) of the p-type electrode. A wired metal layer 32 is formed in the lower surface of the n-type electrode 5 for applying a negative voltage (−voltage) to the n-type electrode 5, and a supporting layer 4 for supporting the semiconductor layer 1, the reflective layer 2 (2a to 2e) and the wired metal layer 31, 32 is formed under the lower surface of the wired metal layer 31, 32.

Figure 29A:
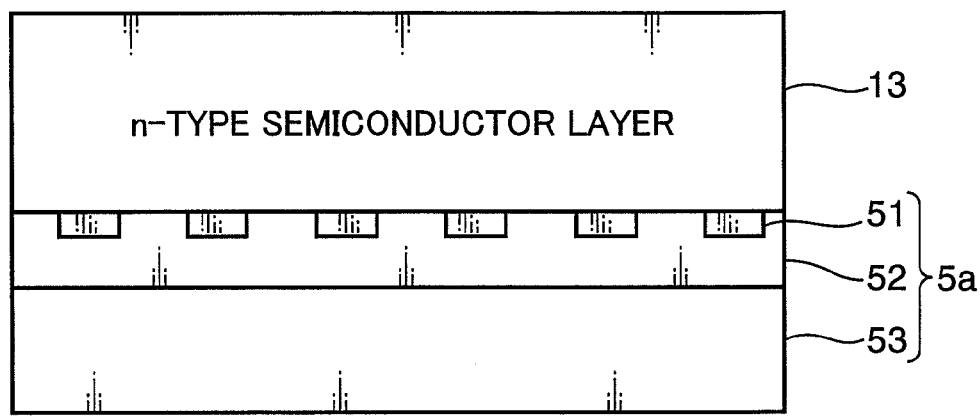

FIG. 29 is a sectional view showing a structure of the n-type electrode 5. For example, as shown in FIG. 29A, the n-type electrode 5 used in such vertical-type or FC-type light-emitting device adopts a platinum layer 51, a conductive oxide layer 52 and a metal layer 53, and an n-type electrode 5a having a reflectance of 80% or more is adopted.

The platinum layer 51 is a layer consisting of platinum (Pt) formed to be mesh-like or island-like in a top view and formed on the n-type semiconductor layer 13 in the semiconductor layer 1. The island-like shape includes, for example, a shape of ellipse (including a circle) and a polygon including a quadrilateral and a hexagon in a top view.

The conductive oxide layer 52 is a layer composed of a metal oxide e.g. ITO and ZnO having electroconductivity and being transparent with respect to the wavelength of light emitted from the light-emitting layer 12. Since the conductive oxide layer 52 has a mesh-like shape or island-like shape, the conductive oxide layer 52 is formed on a surface of the platinum layer 51 so as to partially come in contact with the n-type semiconductor layer 13 of the semiconductor layer 1. In other words, the conductive oxide layer 52 is formed on the surface of the n-type semiconductor layer of the semiconductor layer 1 so that the mesh-like shape or island-like shape platinum layer 51 is formed between the n-type semiconductor layer 13 of the semiconductor layer 1 and the conductive oxide layer 52. When the conductive oxide layer 52 is formed between the n-type semiconductor layer 13 of the semiconductor layer 1 and the metal layer 53, the contact resistance is lowered, thereby electroconductivity i.e. carrier injection efficiency is improved.

The metal layer 53 is a layer consisting of metal (including alloy) such as silver, a silver alloy containing silver as a primary element, aluminum or an aluminum alloy containing aluminum as a primary element. For maintaining a high reflectance in the metal layer 53 high, it is preferable that an area (aperture ratio) of the conductive oxide layer 22 to be in contact with the semiconductor layer is 80% or more.

In one embodiment, such n-type electrode 5a includes the platinum layer 51 having a thickness of 1 nm or less, the conductive oxide layer 22 consisting of ITO having a thickness of 5 nm or less and the metal layer 53 consisting of silver having a thickness of 300 nm, for example. Then, though unillustrated, a nickel (Ni) layer as a ground layer having a thickness of 30 nm and a gold (Au) layer having a thickness of 1000 nm are formed on the metal layer 53 of silver to form an electrode pad.

Figure 29B:
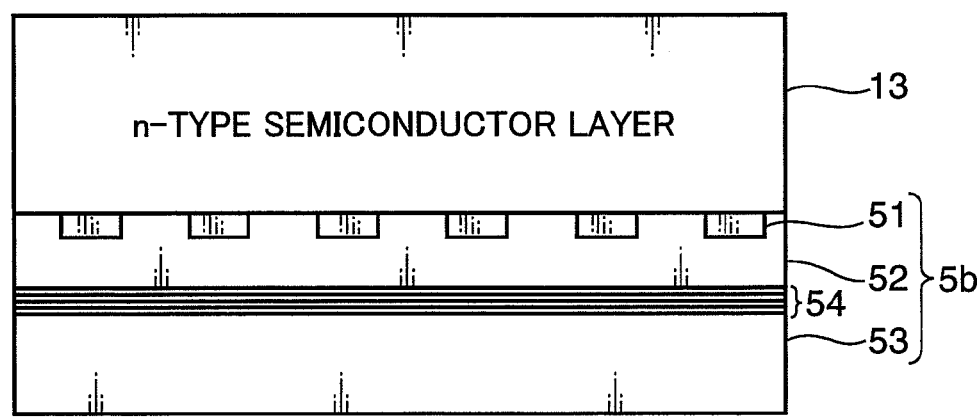

Alternatively, as shown in FIG. 29B for example, the n-type electrode 5 used in such vertical-type or FC-type light-emitting device may adopt the n-type electrode 5b on which a DBR 54 like the DBR 24 according to Embodiment 6 and 7 is provided between the conductive oxide layer 52 and the metal layer 53 in the n-type electrode 5a shown in FIG. 29A. Further, the DBR 54 may be formed to be mesh-like or island-like in top view like the DBR 24 according to Embodiment 8.

Generally, an n-type electrode is composed of metal such as nickel (Ni) having a relatively low reflectance, and the reflectance for improving the light-extraction efficiency has not been taken in consideration. Especially, in the FC-type, it is considered that light is emitted only in an area of the light-emitting layer 12 corresponding to an area where a p-type electrode is formed. Accordingly, it is considered that the reflectance of the n-type electrode does not contribute to improvement of the light-extraction efficiency. Normally, an area of the n-type electrode is about 10% of a whole area of the device. Accordingly, when the reflectance of an n-type electrode is relatively low, e.g. 30%, an average reflectance of the light-emitting device becomes about 80% even if the reflectance of a p-type electrode is improved to be 85% or more. Accordingly, when light multiply reflected in the light-emitting device is extracted, an n-type electrode having low reflectance obstructs improvement of the light-extraction efficiency.

Therefore, an n-type electrode is formed to be an electrode having a reflectance of 80% or more such as the n-type electrodes 5a, 5b shown in FIG. 29. Accordingly, the average reflectance of the light-emitting device can be improved.

As described above, according to the light-emitting device having such arrangement, the n-type electrode 5a, 5b including the platinum layer 51, the conductive oxide layer 52 and the metal layer 53 is adopted. Accordingly, the metal layer 53 has a high reflectance and comes in ohmic contact with the n-type semiconductor layer 13. Consequently, a light-emitting device having high light-extraction efficiency can be provided. In the case where an n-type electrode 5b further provided with the DBR 54, a light emitting device having further high light-extraction efficiency can be provided.

In the case of the above-described n-type electrode 5a, 5b, a silver alloy or an aluminum alloy including one or more n-type dopant substance among silicon (Si), copper (Cu), tellurium (Te), germanium (Ge) and tin (Sn) may be used for the metal layer 53 to lower contact resistance with the n-type semiconductor layer 13. A silver alloy of ATD series produced by Hitachi Metals, Ltd can be quoted as the metal layer 53.

Figure 30A:
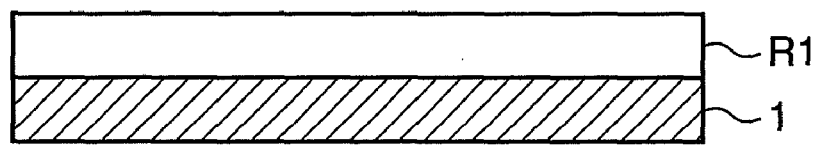
FIG. 30 is a diagram showing a production method in the case of depositing the recess/projection portion 14.
Figure 30B:
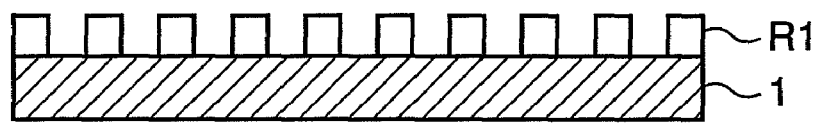
Figure 30C:
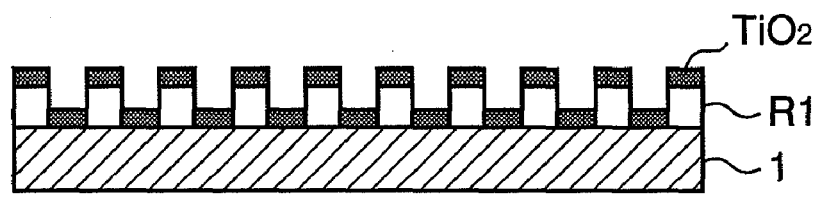
Figure 30D:
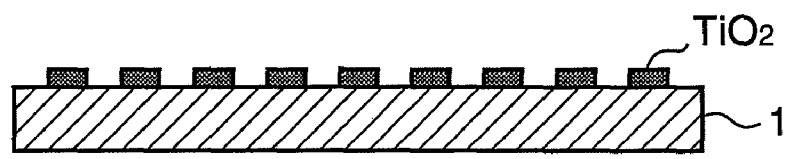

Next, a method for producing a light-emitting device in the case of depositing the recess/projection portion 14 of the Embodiment 1 on the semiconductor layer 1 will be described. FIG. 30 is a diagram showing a method for producing the light-emitting device in the case of depositing the recess/projection portion 14. At first, a resist R1 is coated on an upper surface of the semiconductor layer 1 (FIG. 30A). Next, a shape corresponding to the recess/projection portion 14 is formed on the coated resist R1 by exposing and developing or the nano-printing method (FIG. 30B). Next, a material having the refractive index which is almost same as that of the semiconductor layer 1 is deposited on the resist R1 formed with a shape (FIG. 30C). In the present embodiment, $TiO_2$ having the refractive index which is almost same as the refractive index of a GaN used as the semiconductor layer is deposited on the resist R1. Next, the resist R1 is lifted off (FIG. 30D). Accordingly, the recess/projection portion 14 can be deposited on the semiconductor layer 1.

A microscopic structure like the recess/projection portion 14 formed on a semiconductor surface may be formed by etching such as dry etching. However, a device for realizing the etching is very expensive. Therefore, as shown in FIG. 30, a member having the refractive index which is almost same as that of the semiconductor 1 is deposited on the semiconductor layer 1 to form the recess/projection portion 14. Accordingly, there would be no need to use an expensive etching device so that the recess/projection portion 14 can be formed with low cost.

Embodiment 12

Figure 31:
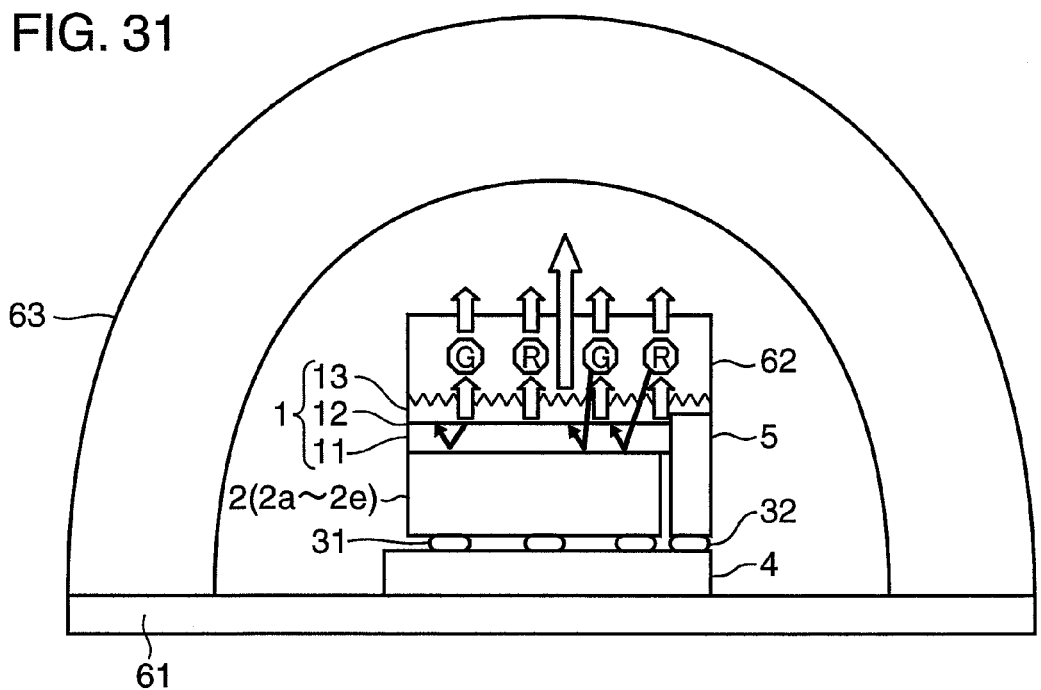
FIG. 31 is a sectional diagram showing a structure of a light-emitting device according to the Embodiment 12.

Next, a light-emitting apparatus according to Embodiment 12 will be described. FIG. 31 is a sectional view showing a structure of the light-emitting apparatus according to the Embodiment 12. The light-emitting apparatus according to the Embodiment 12 is an apparatus adopting the light-emitting device according to the Embodiments 1 to 11 for emitting white light.

As shown in FIG. 31, in the light-emitting apparatus according to the Embodiment 12, the light-emitting device according to the Embodiment 11 is mounted on a circular plate-like board 61. On a light-extracting surface of the light-emitting device, a wavelength-converting layer 62 for converting the wavelength of light emitted from the light-emitting device and emitting the light is formed. These members are sealed with a sealing member 63.

A surface of the board 61 on which the light-emitting device is mounted has a high reflectance to efficiently reflect light emitted from the light-emitting device to the sealing member 63. The board 61 is consisting of metal (including alloy) such as silver and aluminum having a high reflectance.

As shown in FIG. 31, the light-emitting device according to the Embodiment 11 is of an FC-type. The supporting layer 4 thereof is used also as a heat sink for emitting heat generated in the light-emitting layer 12. For the metal layers 31, 32, a gold bump is used. The light-emitting device according to the Embodiment 11 is so configured as to have a light-emission peak at a wavelength of 460 nm for blue color. The light-emitting device according to the Embodiment 11 may be of a vertical type.

The wavelength converting layer 62 is composed of a phosphors dispersing glass having a green phosphor and a red phosphor to allow the light-emitting apparatus according to the present embodiment emit white light. The green phosphor mainly absorbs blue light with a wavelength near 460 nm and emits green light fluorescently. The red phosphor mainly absorbs blue light with a wavelength near 460 nm and emits red light fluorescently. For example, as the green phosphor, $SrGa_2S_4:Eu^{2+}$ or $Y_3(Al, Ga)_5O_{12}:Ce^{3+}$ is used. For example, as the red phosphor, $CaS:Eu^{2+}$ or $SrS:Eu^{2+}$ is used.

Figure 32:
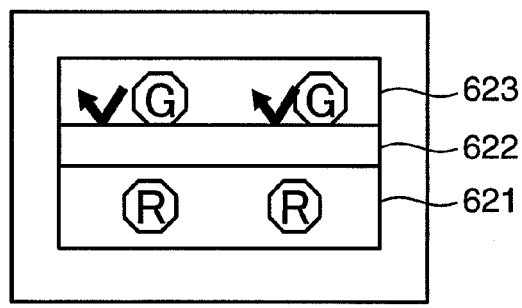
FIG. 32 is a sectional view showing another arrangement of a wavelength converting layer in the light emitting device according to the Embodiment 12.

FIG. 32 is a sectional view showing another arrangement of a wavelength converting layer in the light-emitting apparatus according to the Embodiment 12. As shown in FIG. 32, the wavelength converting layer 62 may have a structure including a red phosphor dispersing glass layer 621 having a red phosphor for mainly absorbing blue light with a wavelength near 460 nm and fluorescently emitting red light, a wavelength selecting filter layer 622 for transmitting blue light and red light and reflecting green light, a green phosphor dispersing glass layer 623 for mainly absorbing blue light with a wavelength near 460 nm and fluorescently emitting green light. The red phosphor dispersing glass layer 621, the wavelength selecting filter layer 622 and the green phosphor dispersing glass layer 623 are layered sequentially in a direction of being placed apart from the light-extracting surface of the light-emitting device. In other words, the red phosphor dispersing glass layer 621 is formed on the light-extracting surface of the light-emitting device, the wavelength selecting filter layer 622 is formed on the surface of the red phosphor dispersing glass layer 621, and the green phosphor dispersing glass layer 623 is formed on the surface of the wavelength selecting filter layer 622. For the wavelength selecting filter layer 622, a DBR having the above-described wavelength-selecting characteristics is used, for example. Normally, a phosphor has an absorption peak of a predetermined wavelength. However, light in a predetermined range of wavelength is absorbed, and light is emitted fluorescently. Therefore, since the red phosphor performs wavelength conversion to green light emitted from the green phosphor to convert it to red light, there is a case where intensity of green light emitted from the light-emitting apparatus shown in FIG. 31 is lowered. Therefore, by forming the wavelength converting layer 62 to have a structure shown in FIG. 32 where the wavelength selecting filter layer 622 is placed between the red phosphor dispersing glass layer 621 and the green phosphor dispersing glass layer 623, green light emitted from the green phosphor dispersing glass layer 623 is reflected on the wavelength selecting filter layer 622, thereby lowering of intensity of green light emitted from the light-emitting apparatus is suppressed.

For example, a glass is used as the sealing member 63 and formed to be a semi-spherical dome shape. Generally, for example in a light emitting apparatus such as an LED, a periphery of the light-emitting device is filled and sealed with a resin having a refractive index higher than that of air to reduce a Fresnel loss. However, in the present invention, the light-emitting apparatus according to the present Embodiment 12 is formed with the recess/projection portion 14 on the light-extracting surface of the semiconductor layer 1 to reduce the Fresnel loss, as described above. Therefore, there is no need to fill a space between the sealing member 63 and the light-emitting device according to the Embodiment 11, but it may be filled with air. In view of this, it is preferable that the surface of the wavelength converting layer 62 is formed to have a recess/projection structure formed with projections in a predetermined pitch. In the case where a periphery of the light-emitting device is not filled with a resin as described above, lowering of duration of the light-emitting apparatus due to deterioration of resin by heat and light can be suppressed.

With the light-emitting apparatus configured as described above, a light-emitting apparatus having a high light-extraction efficiency can be provided.

Figure 33:
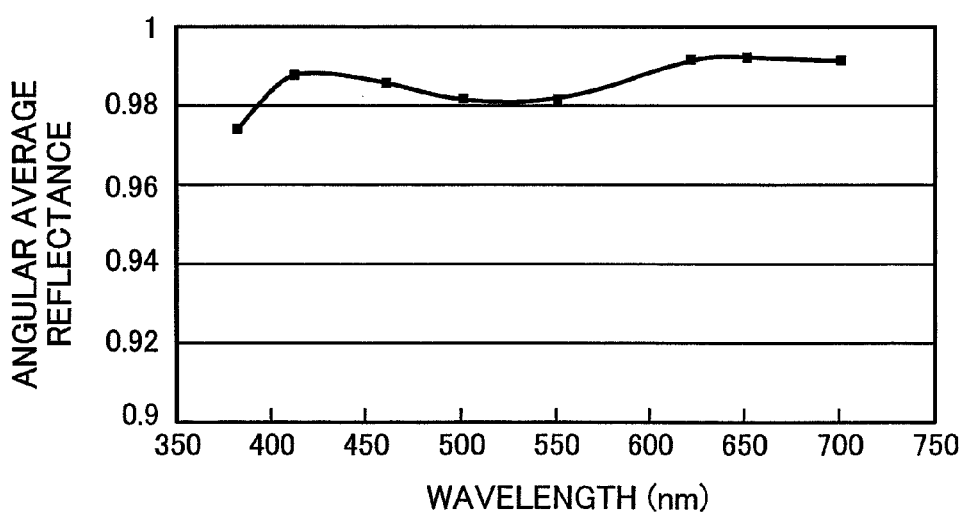
FIG. 33 is a graph showing angular average reflectance characteristic.
Figure 34:
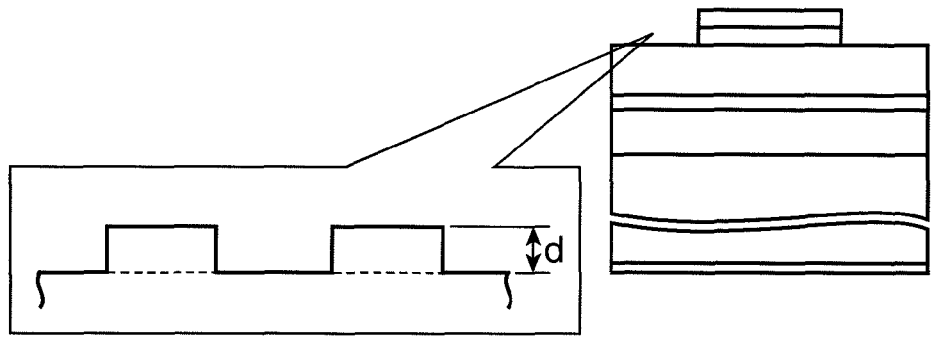
FIG. 34 is a diagram showing a prior art.
Figure 35:
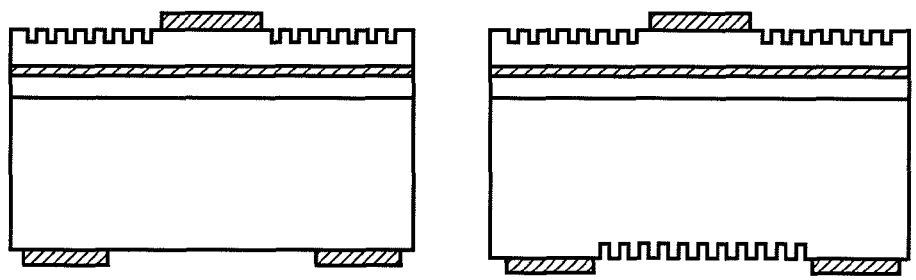
FIG. 35 is a diagram showing a prior art.
Figure 36:
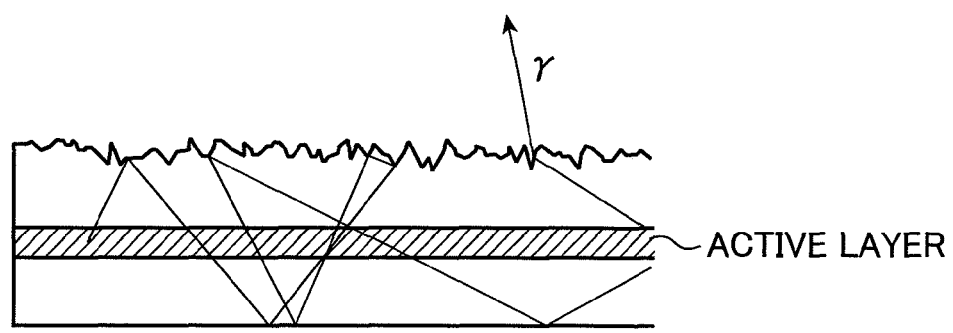
FIG. 36 is a diagram showing a prior art.

FIG. 33 is a graph showing angular average reflectance characteristic. In FIG. 33, the vertical axis shows the reflectance, and the horizontal axis shows the wavelength (nm). The reflectance in this case is an angular average reflectance corresponding to an average value of reflectance with respect to each incident angle between 0 degree and 90 degrees.

As an example of such configuration of the light-emitting apparatus, for example, the reflective layer 2d having an arrangement shown in FIG. 19 is adopted as a reflective layer 2 which functions as a p-type electrode. In the case where the n-type electrode 5b shown in FIG. 29B is adopted as an n-type electrode 5, the average reflectance becomes high in a wide range of wavelength between about 370 nm and about 700 nm, as shown in FIG. 33. Therefore, not only the blue light emitted from the light-emitting device according to Embodiment 11 but also the green and red light emitted respectively from the green phosphor and red phosphor are hardly absorbed in the reflective layer 2 of the p-type electrode and the n-type electrode 5 but are reflected. Thus, according to the light-emitting apparatus according to the Embodiment 12, the light efficiency is improved in a wide range of wavelength between about 370 nm and 700 nm. The light in the range of wavelength between about 370 nm and 700 nm is visible light.

This specification discloses various inventions as described above, but the main inventions are summarized herebelow.

The light-emitting device according to the first aspect comprises: a semiconductor layer including a light-emitting layer; a recess/projection portion including recesses and projections formed in a pitch larger than a wavelength of light emitted from the light-emitting layer, the recess/projection portion being formed in a whole area or a partial area of the surface of the semiconductor layer which light is emitted from; and a reflective layer formed on an opposite surface of the semiconductor layer to the surface from which light is emitted, the reflective layer having a reflectance of 90% or more. It is preferable that cross-sectional shapes of the recesses and projections in the recess/projection portion are substantially similar.

According to this arrangement, light emitted from the light-emitting layer and emitted out of an escape cone is reflected on the surface is affected by the angle-changing by the recess/projection portion and reflected on the surface where the light is emitted. Accordingly, as the light is repeatedly reflected in the semiconductor layer, it is emitted outside. Here, on the side opposite to the light-extracting surface, a reflective layer having a reflectance of 90% or more is formed. Therefore, by synergetic effect of the reflective layer and the recess/projection portion, the light can be emitted efficiently.

As described above, the inventor of the present invention found out that the light-extraction efficiency drastically increases as the reflectance of the reflective layer becomes over 85% in the case where the recess/projection portion is formed on the light-extracting surface and the reflective layer is formed on the side opposite to the light-extracting surface while the light-extraction efficiency is not improved much even if a highly reflective layer having the reflectance of over 85% is formed on the side opposite to the light-extracting surface in a flat structure where the recess/projection portion is not formed on the light-extracting surface i.e. where the light-extracting surface has no angle-changing effect. When the reflectance becomes 90% or more, for example, when the reflectance of the reflective layer is raised by 5% from 90% to 95%, the light-extraction efficiency is raised by 20%. Therefore, by forming recesses and projections on the light-extracting surface and forming a reflective layer having a reflectance of 90% or more on the side opposite to the light-extracting surface, the light-emission ratio can be improved drastically.

The light-emitting device of the second aspect is the light-emitting device according to the first aspect with the recesses and projections formed periodically or randomly.

According to this arrangement, in the case where a pitch of the recess/projection portion is set randomly, light in the light-extracting surface is reflected in various directions and multiply reflected. Accordingly, a possibility that the light is escaped after multiple reflections is raised, and thereby improving the light-extraction efficiency. Further, also in the case where a pitch of the recess/projection portion is set periodically, a possibility that the light is escaped after multiple reflections is raised, thereby further improving the light-extraction efficiency.

The light-emitting device according to the third aspect is the light-emitting device according to the first aspect, where the recess/projection portion has a shape acting as lens.

According to this arrangement, the recess/projection portion has a shape acting as lens. Accordingly, distribution of emitted light can be controlled with the action of lens so that a light-emitting device favorable for use in illuminating equipments and the like can be provided.

The light-emitting device according to the fourth aspect is the light-emitting device according to the third aspect, wherein the shape acting as a lens is a shape of Fresnel lens.

According to this arrangement, the recess/projection portion has a shape of Fresnel lens. Accordingly, a focal distance can be controlled without making the thickness of the recess/projection portion be large.

The light-emitting device according to the fifth aspect is the light-emitting device according to any one of the first to fourth aspects, wherein the semiconductor layer includes a GaN system material, and the reflective layer includes an alloy containing silver as a primary element.

According to this arrangement, the reflective layer includes an alloy containing silver as a primary element having a favorable electroconductivity with respect to a GaN. Accordingly, the light-extraction efficiency can be made better.

The light-emitting device according to the sixth aspect is the light-emitting device according to any one of the first to fourth aspects, wherein the reflective layer includes: a conductive oxide layer formed above a surface of the semiconductor layer; a metal layer formed on the conductive oxide layer, the metal layer consisting of silver, aluminum, a silver alloy containing silver as a primary element, or an aluminum alloy containing aluminum as a primarily element; and a platinum layer formed between the semiconductor layer and the conductive oxide layer, the platinum layer having a mesh-like shape or an island-like shape.

According to the configuration, the reflective layer includes a platinum layer, a conductive oxide layer and a metal layer. Accordingly, since the reflective layer has a high reflectance and comes in ohmic contact with the semiconductor layer, the light-extraction efficiency can be made better.

The light-emitting device according to the seventh aspect is a light-emitting device according to any one of the first to fourth aspects, wherein the reflective layer includes a DBR.

According to this arrangement, the reflective layer includes a DBR. Accordingly, the reflectance of the reflective layer can be made higher.

The light-emitting device according to the eighth aspect is the light-emitting device according to any one of the first to fourth aspects, wherein the reflective layer includes: a metal layer consisting of aluminum, silver, or a silver alloy containing silver as a primary element; and a DBR formed on the metal layer.

According to this arrangement, a reflective layer can be realized which has the reflectance characteristic showing a relation between an incident angle and a reflectance of a DBR and the reflectance characteristics combining the reflectance characteristic of aluminum, silver or a silver alloy can be realized, thereby the light-extraction efficiency can be made higher. In other words, where the reflectance in a DBR is low, the light in an incident angle of passing through the DBR is reflected by aluminum, silver or a silver alloy, and the light at an incident angle where the reflectance is low in aluminum, silver or a silver alloy is reflected by the DBR. Accordingly, the light-extraction efficiency is raised.

The light-emitting device according to the ninth aspect is the light-emitting device according to the eighth aspect, wherein each of layers constituting the DBR has such a thickness as to allow light rays emitted from the light-emitting layer and having a high intensity range and coming at an angular range of a low transmissivity to reflect on the reflective layer at an increased reflectance.

According to this arrangement, the reflectance of incident light at an angular range of a low transmissivity in a high intensity range is increased, and the light at the incident angle is reflected on the reflective layer. Accordingly, the light-extraction efficiency of the light in the incident angle is improved.

The light-emitting device according to the tenth aspect is the light-emitting device according to any one of the first to fourth aspects, wherein the reflective layer includes: a conductive oxide layer formed above a surface of the semiconductor layer; a DBR layered on the conductive oxide layer; a metal layer formed on the DBR layer and consisting of silver, aluminum, a silver alloy containing silver a primary element, or an aluminum alloy containing aluminum as a primary element; and a platinum layer formed between the semiconductor layer and the conductive oxide layer, and having a mesh-like shape or an island-like shape.

According to this arrangement, the reflective layer includes a platinum layer, a conductive oxide layer, a DBR and a metal layer. Accordingly, since the reflective layer has higher reflectance and comes in ohmic contact with the semiconductor layer, the light-extraction efficiency can be made better.

The light-emitting device according to the eleventh aspect is the light-emitting device according to the tenth aspect, wherein the DBR has a mesh-like shape or an island-like shape.

According to this arrangement, the DBR has a mesh-like shape or an island-like shape in a top view. Accordingly, even in the case where electroconductivity of the DBR is low, electric conduction between the conductive oxide layer and the metal layer can be secured.

The light-emitting device according to the twelfth aspect is the light-emitting device according to any one of the first to fourth aspects, wherein the reflective layer includes a photonic crystal.

According to this arrangement, since the reflective layer includes a photonic crystal, a reflective layer having a high reflectance with respect to light rays of any incident angle can be provided.

The light-emitting device according to the thirteenth aspect of the light-emitting device is the light-emitting device according to any one of the first to twelfth aspects, wherein a distance between a bottom plane of the recess/projection portion and an opposite surface of the semiconductor layer to the recess/projection portion is within several folds longer than a wavelength of light emitted from the light-emitting layer and traveling in the semiconductor layer.

According to this arrangement, even a light ray which is emitted in a large angle with respect to the normal line direction of the surface where the light is emitted, for example, an angle close to 90 degrees, or emitted in a lateral direction and not reaching the surface where the light should be emitted is affected by an angle-changing effect by the recess/projection portion. Accordingly, the light-extraction efficiency can be further raised.

The light-emitting device according to the fourteenth aspect is the light-emitting device according to any one of the first to thirteenth aspects, wherein the reflective layer serves as a p-type electrode, further comprising an n-type electrode formed on a surface of the semiconductor layer and having a reflectance of 80% or more, and being operable to associate with the p-type electrode.

According to this arrangement, since the n-type electrode being associated with the p-type electrode of the reflective layer has a reflectance of 80% or more, the average reflectance of the light-emitting device is improved, thereby the light-extraction efficiency can be made better.

The light-emitting device according to the fifteenth aspect is the light-emitting device according to the fourteenth aspect, wherein the n-type electrode includes: a conductive oxide layer formed on the surface of the semiconductor layer; a metal layer formed on the conductive oxide layer and consisting of silver, aluminum, a silver alloy containing silver as a primary element, or an aluminum alloy containing aluminum as a primary element; and a platinum layer formed between the semiconductor layer and the conductive oxide layer, the platinum layer having a mesh-like shape or an island-like shape.

According to this arrangement, the n-type electrode includes a platinum layer, a conductive oxide layer and a metal layer. Accordingly, the n-type electrode has a high reflectance and comes in ohmic contact with the semiconductor layer, thereby the light-extraction efficiency can be made better.

The light-emitting device according to the sixteenth aspect is the light-emitting device according to the fourteenth aspect, wherein the n-type electrode includes: a conductive oxide layer formed on the surface of the semiconductor layer; a DBR formed on the conductive oxide layer; a metal layer formed on the DBR and consisting of silver, aluminum, a silver alloy containing silver as a primary element, or an aluminum alloy containing aluminum as a primary element; and a platinum layer formed between the semiconductor layer and the conductive oxide layer, the platinum layer having a mesh-like shape or an island-like shape.

According to this arrangement, the n-type electrode includes a platinum layer, a conductive oxide layer, a DBR and a metal layer. Accordingly, the n-type electrode has a high reflectance and comes in ohmic contact with the semiconductor layer, thereby the light-extraction efficiency can be made better.

The light-emitting device according to the seventeenth aspect is the light-emitting device according to the sixteenth aspect, wherein the DBR has a mesh-like shape or an island-like shape.

According to this configuration, the DBR has a mesh-like shape or an island-like shape in a top view. Accordingly, even in the case where electroconductivity of the DBR is low, electric conduction between the conductive oxide layer and the metal layer can be secured.

The light-emitting device according to the eighteenth aspect is the light-emitting device according to any one of the first to seventeenth aspects, further comprising a wavelength converting layer formed on a light-extraction surface of the semiconductor layer and adapted for converting the wavelength of light rays emitted from the semiconductor layer and irradiating the same.

According to this arrangement, since the wavelength converting layer is further provided, not only the light of color emitted from the semiconductor layer but also the light of other color can be emitted. Especially, when the semiconductor layer emits blue light, and the wavelength converting layer converts the blue light to light of green and red, white light can be emitted.

A method for producing light emitting device according to the nineteenth aspect is a method for producing light emitting device including: a semiconductor layer including a light-emitting layer; a recess/projection portion including recesses and projections formed in a pitch larger than a wavelength of light emitted from the light-emitting layer, the recess/projection portion being formed on a whole area or a partial area of the surface of the semiconductor layer from which light is emitted; and a reflective layer formed on an opposite surface of the semiconductor layer to the surface from which light is emitted, the reflective layer having a reflectance of 90% or more, the method comprising the step of: depositing a material having a refractive index which is substantially the same as that of the semiconductor layer to form the recess/projection portion.

According to this arrangement, a light-emitting device can be produced without using an expensive etching device so that a light-emitting device caving a high light-extraction efficiency can be produced with low cost.

The present invention is appropriately and sufficiently described in the above through the embodiments with reference to the drawings to express the present invention. However, it should be recognized that a person skilled in the art may easily modify and/or improve the above-described embodiments. Thus, as long as a modified form or an improved form performed by a person skilled in the art is not the one which is apart from the scope of claims described in CLAIMS, the modified form or improved form is considered to be included in the scope of claims.

Industrial Applicability

According to the present invention, a light-emitting device composed of a semi-conductor is provided.

The invention claimed is:

1. A light-emitting device comprising:
   a semiconductor layer comprising
      a light-emitting layer;
      a recess/projection portion including recesses and projections formed in a pitch larger than a wavelength of light emitted from the light-emitting layer, the recess/projection portion being formed in a whole area or a partial area of the surface of the semiconductor layer which light is emitted from; and
   a reflective layer formed on an opposite surface of the semiconductor layer to the surface from which light is emitted, the reflective layer having a reflectance of 90% or more,
   wherein the semiconductor layer includes a GaN system material, and the reflective layer includes an alloy containing silver as a primary element, wherein the reflective layer is in ohmic contact with the semiconductor.

2. The light-emitting device according to claim 1, wherein the recesses and projections of the recess/projection portion are formed periodically or randomly.

3. The light-emitting device according to claim 1, wherein the recess/projection portion has a shape acting as a lens.

4. The light-emitting device according to claim 3, wherein the shape acting as a lens is a shape of Fresnel lens.

5. The light-emitting device according to claim 1, wherein the reflective layer includes:
   a conductive oxide layer formed above a surface of the semiconductor layer;
   a metal layer formed on the conductive oxide layer, the metal layer consisting of silver, aluminum, a silver alloy containing silver as a primary element, or an aluminum alloy containing aluminum as a primarily element; and a platinum layer formed between the semiconductor layer and the conductive oxide layer, the platinum layer having a mesh-like shape or an island-like shape.

6. The light-emitting device according to claim 1, wherein the reflective layer includes a DBR.

7. The light-emitting device according to claim 1, wherein the reflective layer includes:
a metal layer consisting of aluminum, silver, or a silver alloy containing silver as a primary element; and
a DBR formed on the metal layer.

8. The light-emitting device according to claim 7, wherein each of the layers constituting the DBR has such a thickness as to allow light rays emitted from the light-emitting layer and having a high intensity range and coming at an angular range of a low transmissivity to reflect on the reflective layer at an increased reflectance.

9. The light-emitting device according to claim 1, wherein the reflective layer includes:
a conductive oxide layer formed above a surface of the semiconductor layer;
a DBR layered on the conductive oxide layer;
a metal layer formed on the DBR layer and consisting of silver, aluminum, a silver alloy containing silver as a primary element, or an aluminum alloy containing aluminum as a primary element; and
a platinum layer formed between the semiconductor layer and the conductive oxide layer, and having a mesh-like shape or an island-like shape.

10. The light-emitting device according to claim 9, wherein the DBR has a mesh-like shape or an island-like shape.

11. The light-emitting device according to claim 1, wherein the reflective layer includes a photonic crystal.

12. The light-emitting device according to claim 1, wherein a distance between a bottom plane of the recess/projection portion and an opposite surface of the semiconductor layer to the recess/projection portion is within several folds longer than a wavelength of light emitted from the light-emitting layer and traveling in the semiconductor layer.

13. The light-emitting device according to claim 1, wherein the reflective layer serves as a p-type electrode, further comprising an n-type electrode formed on a surface of the semiconductor layer and having a reflectance of 80% or more, and being operable to associate with the p-type electrode.

14. The light-emitting device according to claim 13, wherein the n-type electrode includes:
a conductive oxide layer formed on the surface of the semiconductor layer;
a metal layer formed on the conductive oxide layer and consisting of silver, aluminum, a silver alloy containing silver as a primary element, or an aluminum alloy containing aluminum as a primary element; and
a platinum layer formed between the semiconductor layer and the conductive oxide layer, the platinum layer having a mesh-like shape or an island-like shape.

15. The light-emitting device according to claim 13, wherein the n-type electrode includes:
a conductive oxide layer formed on the surface of the semiconductor layer;
a DBR formed on the conductive oxide layer;
a metal layer formed on the DBR and consisting of silver, aluminum, a silver alloy containing silver as a primary element, or an aluminum alloy containing aluminum as a primary element; and
a platinum layer formed between the semiconductor layer and the conductive oxide layer, the platinum layer having a mesh-like shape or an island-like shape.

16. The light-emitting device according to claim 15, wherein the DBR has a mesh-like shape or an island-like shape.

17. The light-emitting device according to claim 1, further comprising a wavelength converting layer formed on a light-extraction surface of the semiconductor layer and adapted for converting the wavelength of light rays emitted from the semiconductor layer and irradiating the same.

18. The light-emitting device according to claim 1, wherein said device has a light extraction efficiency of 55% or more.

19. A method for producing a light-emitting device, comprising:
a semiconductor layer comprising
a light-emitting layer, and
a recess/projection portion including recesses and projections formed in a pitch larger than a wavelength of light emitted from the light-emitting layer, the recess/projection portion being formed on a whole area or a partial area of the surface of the semiconductor layer from which light is emitted;
a wavelength converting layer formed on a light-extraction surface of the semiconductor layer and adapted for converting the wavelength of light rays emitted from the semiconductor layer and irradiating the same; and
a reflective layer formed on an opposite surface of the semiconductor layer to the surface from which light is emitted, the reflective layer having a reflectance of 90% or more, the method comprising:
depositing a material having a refractive index which is substantially the same as that of the semiconductor layer to form the recess/projection portion, and
forming a wavelength converting layer on a light-extraction surface of the semiconductor layer wherein the reflective layer is in ohmic contact with the semiconductor.

20. A light-emitting device comprising:
a semiconductor layer comprising
a light-emitting layer, and
a recess/projection portion including recesses and projections formed in a pitch larger than a wavelength of light emitted from the light-emitting layer, the recess/projection portion being formed in a whole area or a partial area of the surface of the semiconductor layer which light is emitted from; and
a reflective layer formed on an opposite surface of the semiconductor layer to the surface from which light is emitted, the reflective layer having a reflectance of 95% or more, wherein the semiconductor layer includes a GaN system material, and said reflective layer includes:
a conductive oxide layer formed on a surface of the semiconductor layer;
a metal layer formed on the conductive oxide layer, the metal layer comprising an alloy containing silver as a primary element; and
a platinum layer formed between the semiconductor layer and the conductive oxide layer, the platinum layer having a mesh-like shape or an island-like shape wherein the reflective layer is in ohmic contact with the semiconductor.

21. The light-emitting device according to claim 20, wherein said device has a light extraction efficiency of 77% or more.

* * * * *